(12) United States Patent
Tran et al.

(10) Patent No.: US 10,755,900 B2
(45) Date of Patent: Aug. 25, 2020

(54) MULTI-LAYER PLASMA EROSION PROTECTION FOR CHAMBER COMPONENTS

(71) Applicant: Applied Materials, Inc., Santa Clara, CA (US)

(72) Inventors: Toan Tran, San Jose, CA (US); Laksheswar Kalita, San Jose, CA (US); Tae Won Kim, San Jose, CA (US); Dmitry Lubomirsky, Cupertino, CA (US); Xiaowei Wu, San Jose, CA (US); Xiao-Ming He, Freemont, CA (US); Cheng-Hsuan Chou, Santa Clara, CA (US); Jennifer Y. Sun, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 193 days.

(21) Appl. No.: 15/965,794

(22) Filed: Apr. 27, 2018

(65) Prior Publication Data

US 2018/0330923 A1    Nov. 15, 2018

Related U.S. Application Data

(60) Provisional application No. 62/504,471, filed on May 10, 2017.

(51) Int. Cl.
*C23C 16/40* (2006.01)
*H01J 37/32* (2006.01)
(Continued)

(52) U.S. Cl.
CPC .... *H01J 37/32495* (2013.01); *C23C 16/0254* (2013.01); *C23C 16/04* (2013.01);
(Continued)

(58) Field of Classification Search
CPC ........... H01J 37/32495; H01J 37/32477; H01J 2237/0203; C23C 28/042;
(Continued)

(56) References Cited

U.S. PATENT DOCUMENTS 5,630,314 A    5/1997  Kojima et al.
5,693,139 A *  12/1997 Nishizawa ............ C23C 16/455
                                                    117/89
(Continued)

FOREIGN PATENT DOCUMENTS

JP    2006-082474 A    3/2006
JP    2007-131951 A    5/2007
(Continued)

*Primary Examiner* — Rudy Zervigon
(74) *Attorney, Agent, or Firm* — Lowenstein Sandler LLP

(57) ABSTRACT

A method of applying a multi-layer plasma resistant coating on an article comprises performing plating or ALD to form a conformal first plasma resistant layer on an article, wherein the conformal first plasma resistant layer is formed on a surface of the article and on walls of high aspect ratio features in the article. The conformal first plasma resistant coating has a porosity of approximately 0% and a thickness of approximately 200 nm to approximately 1 micron. One of electron beam ion assisted deposition (EB-IAD), plasma enhanced chemical vapor deposition (PECVD), aerosol deposition or plasma spraying is then performed to form a second plasma resistant layer that covers the conformal first plasma resistant layer at a region of the surface but not at the walls of the high aspect ratio features.

18 Claims, 8 Drawing Sheets

(51) Int. Cl.
*C23C 16/02* (2006.01)
*C23C 28/04* (2006.01)
*C23C 16/455* (2006.01)
*C23C 16/04* (2006.01)
*C23C 16/44* (2006.01)
*C23C 24/04* (2006.01)
*C23C 18/36* (2006.01)
*C25D 7/12* (2006.01)

(52) U.S. Cl.
CPC ............ *C23C 16/40* (2013.01); *C23C 16/403* (2013.01); *C23C 16/4404* (2013.01); *C23C 16/45544* (2013.01); *C23C 16/45565* (2013.01); *C23C 24/04* (2013.01); *C23C 28/042* (2013.01); *H01J 37/32477* (2013.01); *C23C 16/45525* (2013.01); *C23C 18/36* (2013.01); *C25D 7/123* (2013.01); *H01J 2237/0203* (2013.01)

(58) Field of Classification Search
CPC .............. C23C 16/45544; C23C 16/04; C23C 16/4404; C23C 16/45565; C23C 16/40; C23C 24/04; C23C 16/403; C23C 16/0254; C23C 18/36; C23C 16/45525; C23C 16/45531; C23C 16/45546; C23C 16/30; H01L 21/67069; H01L 21/67017; H01L 21/67011; H01L 21/02104; H01L 21/02247; H01L 21/0223; H01L 21/02189; H01L 21/0228; H01L 21/02178; H01L 21/02186; H01L 21/02181; H01L 21/02126; C25D 7/123
USPC .................. 118/715; 156/345.33, 345.34
See application file for complete search history.

(56) References Cited

U.S. PATENT DOCUMENTS

| | | | |
|---|---|---|---|
| 5,819,434 A * | 10/1998 | Herchen | C23C 16/45565 34/232 |
| 5,840,434 A | 11/1998 | Kojima et al. | |
| 6,139,983 A | 10/2000 | Ohashi et al. | |
| 6,444,083 B1 | 9/2002 | Steger et al. | |
| 6,502,530 B1 * | 1/2003 | Turlot | H01J 37/32623 118/723 E |
| 6,548,424 B2 | 4/2003 | Putkonen | |
| 6,632,549 B1 | 10/2003 | Ohashi et al. | |
| 6,641,941 B2 | 11/2003 | Yamada et al. | |
| 6,777,353 B2 | 8/2004 | Putkonen | |
| 6,858,332 B2 | 2/2005 | Yamada | |
| 6,858,546 B2 | 2/2005 | Niinisto et al. | |
| 6,916,534 B2 | 7/2005 | Wataya et al. | |
| 7,138,192 B2 | 11/2006 | Yamada et al. | |
| RE39,939 E * | 12/2007 | Okayama | C23C 16/455 156/345.34 |
| RE39,969 E * | 1/2008 | Okayama | H01J 37/3244 156/345.34 |
| RE40,046 E * | 2/2008 | Okayama | H01J 37/3244 29/745 |
| 7,351,658 B2 | 4/2008 | Putkonen | |
| 7,384,696 B2 | 6/2008 | Hayasaki et al. | |
| 7,498,272 B2 | 3/2009 | Niinisto et al. | |
| 7,560,376 B2 | 7/2009 | Escher et al. | |
| 7,569,280 B2 | 8/2009 | Hayasaki et al. | |
| 7,604,845 B2 * | 10/2009 | Takeuchi | C23C 4/01 427/446 |
| 7,696,117 B2 | 4/2010 | Sun et al. | |
| 7,754,621 B2 | 7/2010 | Putkonen | |
| 7,780,786 B2 | 8/2010 | Mitsuhashi et al. | |
| 7,879,182 B2 * | 2/2011 | Ohmi | C23C 16/45565 118/715 |
| 7,968,205 B2 | 6/2011 | Nakano et al. | |
| 7,998,883 B2 | 8/2011 | Putkonen | |
| 8,372,200 B2 * | 2/2013 | Okesaku | C23C 16/45565 118/715 |
| 8,431,996 B2 * | 4/2013 | Sakamoto | C23C 16/24 257/350 |
| 8,546,272 B2 * | 10/2013 | Hirose | C23C 16/30 438/770 |
| 8,619,406 B2 | 12/2013 | Cho et al. | |
| 8,858,745 B2 | 10/2014 | Sun et al. | |
| 8,916,021 B2 | 12/2014 | Sun et al. | |
| 8,946,092 B2 * | 2/2015 | Hirose | C23C 16/30 438/770 |
| 9,012,030 B2 | 4/2015 | Han et al. | |
| 9,068,265 B2 * | 6/2015 | Lubomirsky | C23C 16/45563 |
| 9,082,593 B2 * | 7/2015 | Hayashi | H01J 37/32449 |
| 9,090,046 B2 | 7/2015 | Sun et al. | |
| 9,243,327 B2 * | 1/2016 | Komori | C23C 16/24 |
| 9,275,840 B2 * | 3/2016 | Glukhoy | H01J 37/32449 |
| 9,343,289 B2 | 5/2016 | Sun et al. | |
| 9,394,615 B2 * | 7/2016 | Sun | C23F 1/08 |
| 9,431,221 B2 * | 8/2016 | Chen | H01L 21/3065 |
| 9,484,190 B2 * | 11/2016 | Glukhoy | H01J 37/3244 |
| 9,583,369 B2 | 2/2017 | Sun et al. | |
| 9,617,633 B2 | 4/2017 | He et al. | |
| 9,633,884 B2 | 4/2017 | He et al. | |
| 10,167,553 B2 * | 1/2019 | Rasheed | C23C 16/455 |
| 10,519,546 B2 * | 12/2019 | Jallepally | C23C 16/458 |
| 2002/0177001 A1 | 11/2002 | Harada et al. | |
| 2003/0051811 A1 | 3/2003 | Uchimaru et al. | |
| 2003/0209323 A1 * | 11/2003 | Yokogaki | C23C 16/455 156/345.34 |
| 2004/0058070 A1 * | 3/2004 | Takeuchi | C23C 4/01 427/282 |
| 2005/0227118 A1 | 10/2005 | Uchimaru et al. | |
| 2006/0037536 A1 | 2/2006 | Kobayashi et al. | |
| 2006/0073354 A1 | 4/2006 | Watanabe et al. | |
| 2006/0105104 A1 * | 5/2006 | Tada | C23C 16/45565 427/248.1 |
| 2007/0144671 A1 * | 6/2007 | Ohmi | H01J 37/3244 156/345.34 |
| 2008/0066647 A1 | 3/2008 | Harada et al. | |
| 2008/0305246 A1 * | 12/2008 | Choi | C23C 16/45565 427/74 |
| 2010/0119844 A1 | 5/2010 | Sun et al. | |
| 2010/0129670 A1 | 5/2010 | Sun et al. | |
| 2010/0323124 A1 | 12/2010 | Vartabedian et al. | |
| 2011/0091700 A1 | 4/2011 | Simpson | |
| 2011/0198034 A1 * | 8/2011 | Sun | C23C 4/02 156/345.34 |
| 2011/0256733 A1 * | 10/2011 | Hirose | C23C 16/30 438/770 |
| 2012/0115314 A1 * | 5/2012 | Sakamoto | C23C 16/24 438/479 |
| 2012/0135155 A1 | 5/2012 | Han et al. | |
| 2012/0193456 A1 * | 8/2012 | Lubomirsky | C23C 16/45563 239/548 |
| 2012/0247673 A1 * | 10/2012 | Hayashi | H01J 37/32449 156/345.33 |
| 2013/0118405 A1 * | 5/2013 | Ho | C23C 16/4409 118/715 |
| 2014/0116338 A1 | 5/2014 | He et al. | |
| 2014/0120312 A1 | 5/2014 | He et al. | |
| 2015/0004418 A1 | 1/2015 | Sun et al. | |
| 2015/0061237 A1 | 3/2015 | Sun et al. | |
| 2015/0064450 A1 | 3/2015 | Sun et al. | |
| 2015/0152540 A1 | 6/2015 | Sato et al. | |
| 2015/0214009 A1 * | 7/2015 | Glukhoy | H01J 37/3244 239/132.3 |
| 2015/0214013 A1 * | 7/2015 | Glukhoy | H01J 37/32449 29/527.1 |
| 2015/0299050 A1 | 10/2015 | Sun et al. | |
| 2015/0307982 A1 | 10/2015 | Firouzdor et al. | |
| 2015/0311043 A1 | 10/2015 | Sun et al. | |
| 2015/0311044 A1 | 10/2015 | Sun et al. | |
| 2015/0321964 A1 | 11/2015 | Sun et al. | |
| 2015/0329955 A1 | 11/2015 | Sun et al. | |
| 2016/0013081 A1 * | 1/2016 | Chen | H01L 21/3065 438/710 |

(56) References Cited

U.S. PATENT DOCUMENTS

| | | | |
|---|---|---|---|
| 2016/0079040 A1 | 3/2016 | Park et al. | |
| 2016/0211121 A1 | 7/2016 | Sun et al. | |
| 2016/0312351 A1 | 10/2016 | Liu et al. | |
| 2016/0326626 A1 | 11/2016 | Sun et al. | |
| 2016/0375515 A1* | 12/2016 | Xu | B23K 1/0008 |
| | | | 428/623 |
| 2016/0379806 A1 | 12/2016 | Xu et al. | |
| 2017/0022595 A1 | 1/2017 | Sato et al. | |
| 2017/0110293 A1 | 4/2017 | Sun et al. | |
| 2017/0130319 A1 | 5/2017 | Sun et al. | |
| 2017/0133207 A1 | 5/2017 | Sun et al. | |
| 2017/0314125 A1* | 11/2017 | Fenwick | C23C 16/403 |
| 2018/0105932 A1* | 4/2018 | Fenwick | C23C 16/403 |
| 2018/0330923 A1* | 11/2018 | Tran | C23C 24/04 |
| 2019/0348261 A1* | 11/2019 | Lin | H01J 37/32495 |
| 2020/0043707 A1* | 2/2020 | Nomura | H01L 21/31 |
| 2020/0087788 A1* | 3/2020 | Tan | C23C 16/509 |

FOREIGN PATENT DOCUMENTS

| | | |
|---|---|---|
| JP | 2007-217782 A | 8/2007 |
| KR | 2017-0044396 A | 4/2017 |
| WO | 2013/032260 A2 | 3/2013 |

\* cited by examiner

MULTI-LAYER PLASMA EROSION PROTECTION FOR CHAMBER COMPONENTS

RELATED APPLICATIONS

This patent application claims the benefit under 35 U.S.C. § 119(e) of U.S. Provisional Application No. 62/504,471, filed May 10, 2017.

TECHNICAL FIELD

Embodiments of the present disclosure relate, in general, to ceramic coated articles and to a process for applying a multi-layer ceramic coating onto chamber components.

BACKGROUND

In the semiconductor industry, devices are fabricated by a number of manufacturing processes producing structures of an ever-decreasing size. Some manufacturing processes such as plasma etch and plasma clean processes expose a substrate to a high energy plasma to etch or clean the substrate. The plasma may be highly corrosive, and may corrode processing chambers and other surfaces that are exposed to the plasma. This corrosion may generate particles, which frequently contaminate the substrate that is being processed, contributing to device defects.

As device geometries shrink, susceptibility to defects increases and particle and contaminant requirements become more stringent. Accordingly, as device geometries shrink, allowable levels of particle contamination may be reduced.

Many chamber components such as showerheads, plasma sources, pedestals and liners used in semiconductor etch and selective removal chambers are made of bare aluminum or anodized aluminum. However, when exposed to fluorine-based plasma these chamber components become fluorinated and cause particle contamination. Additionally, showerheads contain numerous holes through which gases are flowed. The diameter of these holes changes over time due to accumulation of fluoride particle buildup. The change in hole diameter causes process drift and etch-rate drift over time, which reduces the lifespan of the showerhead.

SUMMARY

Some embodiments of the disclosure are directed to a process for forming a multi-layer plasma resistant coating having a conformal first plasma resistant layer and a second plasma resistant layer. Some embodiments are directed to an article such as a chamber component for a processing chamber that includes a multi-layer plasma resistant coating.

In one embodiment, an article comprises a body comprising a surface and a plurality of high aspect ratio features in the body. The plurality of high aspect ratio features have an aspect ratio of about 3:1 to about 300:1. In one embodiment, the high aspect ratio features have an aspect ratio of 1:1 to 300:1, or an aspect ratio of 10:1 to 300:1. The aspect ratio is a measure of a length of the feature to a width or diameter of the feature (e.g., the ratio of the depth of a hole to the diameter of the hole). The article further comprises a conformal first plasma resistant layer on the surface and on walls of the plurality of high aspect ratio features. The first plasma resistant layer has a porosity of approximately 0% and a thickness of approximately 100 nm to approximately 10 microns (or about 200 nm to about 1 micron). The article further comprises a second plasma resistant layer (e.g., a conformal second plasma resistant layer) that covers the conformal first plasma resistant layer at a region of the surface but not at the walls of the plurality of high aspect ratio features. The second plasma resistant layer may be a conformal second plasma resistant layer having a porosity of less than 1% and a thickness of approximately 1-10 microns.

In one embodiment, an article comprises a body comprising a surface and a plurality of high aspect ratio features in the body. The plurality of high aspect ratio features have an aspect ratio of about 10:1 to about 300:1. A region of the surface has a surface roughness of approximately 200-300 micro-inches. The article further comprises a conformal first plasma resistant layer on the surface and on walls of the plurality of high aspect ratio features. The first plasma resistant layer has a porosity of approximately 0% and a thickness of approximately 100 nm to approximately 10 microns (or about 200 nm to about 1 micro). A surface of the conformal first plasma resistant layer has the surface roughness of approximately 200-300 micro-inches. The article further comprises a second plasma resistant layer that covers the conformal first plasma resistant layer at the region of the surface but not at the walls of the plurality of high aspect ratio features. The second plasma resistant layer has a porosity of approximately 1-5% and a thickness of approximately 4-20 mils (e.g., 5-10 mils). The surface roughness of the conformal first plasma resistant layer facilitates adhesion of the second plasma resistant layer to the conformal first plasma resistant layer.

In one embodiment, a method of forming a multi-layer plasma resistant coating comprises performing coating techniques including but not limited to plating (e.g., electroplating) and atomic layer deposition (ALD) to form a conformal first plasma resistant layer on an article. The conformal first plasma resistant layer is formed on a surface of the article and on walls of a plurality of high aspect ratio features in the article. The plurality of high aspect ratio features have an aspect ratio of about 10:1 to about 300:1. The conformal first plasma resistant layer has a porosity of approximately 0% and a thickness of approximately 100 nm to about 10 microns (or about 200 nm to approximately 1 micron). The method further comprises performing a line of sight deposition method, including one of electron beam ion assisted deposition (EB-IAD), plasma enhanced chemical vapor deposition (PECVD), aerosol deposition or plasma spraying to form a second plasma resistant layer that covers the conformal first plasma resistant layer at a region of the surface but not at the walls of the plurality of high aspect ratio features.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1A:
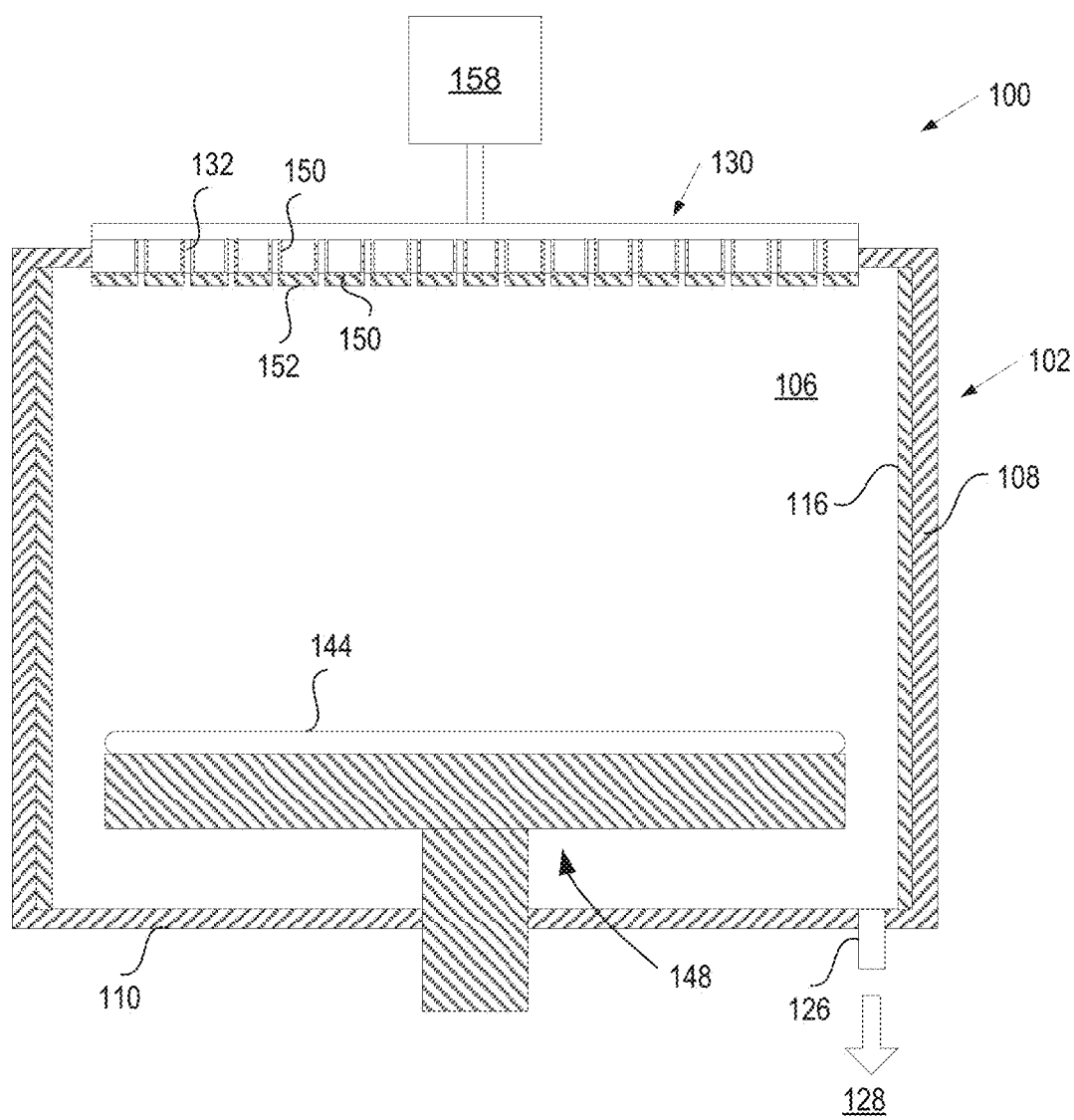
FIG. 1A depicts a sectional view of one embodiment of a processing chamber.

Some embodiments of the disclosure are directed to a process for forming a multi-layer plasma resistant coating having conformal first plasma resistant layer and a second plasma resistant layer that may or may not be conformal. In some embodiments, the multi-layer plasma resistant coating additionally includes a conformal third plasma resistant layer. As used herein the term conformal as applied to a layer means a layer that covers three dimensional features of an article with a substantially uniform thickness. In one embodiment, conformal layers discussed herein have a conformal coverage of the underlying surface that is coated (including coated surface features) with a uniform thickness having a thickness variation of less than about +/−20%, a thickness variation of +/−10%, a thickness variation of +/−5%, or a lower thickness variation. The conformal first plasma resistant layer is deposited using a non-line-of-site coating technique such as plating (e.g., electroplating) or atomic layer deposition (ALD), and coats both a surface an article and walls of high aspect ratio features (e.g., holes or conduits) in the article. As used herein, the term high aspect ratio means an aspect ratio of 3:1 to an aspect ratio of 300:1. Some example high aspect ratio features have aspect ratios of 10:1, 20:1, 50:1 and 100:1. The second plasma resistant layer is deposited using a line-of-site coating technique such as plasma spraying, aerosol deposition, ion assisted deposition (e.g., electron beam ion assisted deposition (EB-IAD), plasma enhanced ALD (PE-ALD) and plasma enhanced chemical vapor deposition (PE-CVD). Other line of sight deposition techniques that may be used for depositing the second plasma resistant layer include physical vapor deposition (PVD), cold spray and thermal spraying processes such as atmospheric plasma spray, suspension plasma spray, low pressure plasma spray, and so on. The two protective layers may have different thicknesses and/or densities. The processes disclosed herein provide improved plasma resistance performance for chamber components.

One example of an article that may be coated using the multi-layer plasma resistant coating described herein is a showerhead for a processing chamber such as a plasma etcher. The showerhead may be made of a metal such as aluminum or an aluminum alloy (e.g., Al 6061). The showerhead may include many holes or conduits through which gases are flowed during processing. The showerhead may additionally include a surface having a region that is directly exposed to bombardment by ions and radicals in a plasma (e.g., fluorine based plasma) during processing. The multi-layer plasma resistant coating described in embodiments herein includes a thin conformal first plasma resistant layer that coats the holes/conduits as well as the surface of the showerhead. The multi-layer plasma resistant coating additionally includes a thicker plasma resistant layer that covers the conformal first plasma resistant layer at the region of the surface that is exposed to plasma.

The conformal first plasma resistant layer protects the holes in the showerhead from erosion by fluorine chemistries (e.g., $NF_3$). Additionally, the conformal first plasma resistant layer mitigates the buildup of fluoride particles on the walls of the holes in the showerhead. The conformal first plasma resistant layer therefore reduces process and etch-rate drift caused by changes in the diameter of the holes due to fluoride particle buildup. Furthermore, the conformal first plasma resistant layer reduces particle deposits on processed substrates (e.g., wafers) by mitigating the fluoride particle buildup on the hole walls and reducing erosion of the hole walls.

The second plasma resistant layer provides the showerhead with a breakdown voltage of 500-1500 volts per mil (V/mil). If the second plasma resistant layer is a plasma sprayed layer or a layer deposited by aerosol deposition, then the breakdown voltage may be about 500-1000 V/mil. If the second plasma resistant layer is a denser layer formed by IAD, PE-CVD or PVD, then the breakdown voltages may be about 1000-1500 V/mil. The second plasma resistant layer additionally protects the surface of the showerhead from erosion and/or corrosion by plasma (e.g., by a fluorine based plasma). In some instances the fluorine based plasma may penetrate the first plasma resistant layer (e.g., if the first plasma resistant layer has vertical cracks or a porosity of greater than 1%). In such instances, the first plasma resistant layer protects the surface of the showerhead from erosion and/or corrosion by the fluorine plasma that penetrates the second plasma resistant layer.

In some embodiments, the multi-layer plasma resistant coating includes a conformal third plasma resistant layer. The conformal third plasma resistant layer may be formed by ALD, for example. The conformal third plasma resistant layer may cover the second plasma resistant layer at the region that is exposed to bombardment by ions and radicals, and may cover the conformal first plasma resistant layer on the hole walls. The conformal third plasma resistant layer may be added in some embodiments where the second plasma resistant layer is a plasma sprayed layer or a layer deposited by aerosol deposition. The conformal third plasma resistant layer may act as a capping layer that seals in cracks, pores, particles, and/or other surface defects at the surface of the second plasma resistant layer.

In some embodiments, the multi-layer plasma resistant coating includes a conformal third layer that is deposited prior to deposition of the conformal first plasma resistant layer. The conformal third layer may be an amorphous layer than may mitigate stress and cracking in the conformal first plasma resistant layer.

The multi-layer plasma resistant coating may be highly resistant to plasma etching by fluorine based plasmas. Performance properties of the coated article may include a long lifespan and a low on-wafer particle and metal contamination. Additionally, the multi-layer plasma resistant coating may reduce process and etch-rate drift that typically occurs with time. Accordingly, embodiments can reduce tool down time, reduce tool cost, reduce particles and contamination of processed substrates, and improve process-to-process uniformity.

When the terms "about" and "approximately" are used herein, these are intended to mean that the nominal value presented is precise within ±10%. Embodiments are descried herein with reference to a showerhead, and are particularly useful for coating chamber components having both high aspect ratio features and regions that are directly exposed to bombardment by a plasma. However, the multi-layer plasma resistant coating described herein can also be beneficially used on many other chamber components that are exposed to plasma, such as chamber components for a plasma etcher (also known as a plasma etch reactor) or other processing chamber including walls, liners, bases, rings, view ports, lids, nozzles, substrate holding frames, electrostatic chucks (ESCs), face plates, selectivity modulation devices (SMDs), plasma sources, pedestals, and so forth.

Moreover, embodiments are described herein with reference to coated chamber components and other articles that may cause reduced particle contamination when used in a process chamber for plasma rich processes. However, it should be understood that the coated articles discussed herein may also provide reduced particle contamination when used in process chambers for other processes such as non-plasma etchers, non-plasma cleaners, chemical vapor deposition (CVD) chambers, physical vapor deposition (PVD) chambers, and so forth. Moreover, some embodiments are described with reference to specific plasma resistant ceramics. However, it should be understood that embodiments equally apply to other plasma resistant ceramics than those discussed herein.

FIG. 1A is a sectional view of a processing chamber 100 (e.g., a semiconductor processing chamber) having one or more chamber components that are coated with a multi-layer plasma resistant coating in accordance with embodiments of the present invention. The processing chamber 100 may be used for processes in which a corrosive plasma environment is provided. For example, the processing chamber 100 may be a chamber for a plasma etch reactor (also known as a plasma etcher), a plasma cleaner, and so forth. Examples of chamber components that may include a plasma resistant ceramic coating are a substrate support assembly 148, an electrostatic chuck (ESC), a ring (e.g., a process kit ring or single ring), a chamber wall, a base, a showerhead 130, a gas distribution plate, a liner, a liner kit, a shield, a plasma screen, a flow equalizer, a cooling base, a chamber viewport, a chamber lid, a nozzle, process kit rings, and so on.

In one embodiment, the multi-layer plasma resistant coating, which is described in greater detail below, is a multi-layer coating including a conformal thin first plasma resistant layer deposited by plating (e.g., electroplating) or atomic layer deposition (ALD) and a thicker second plasma resistant layer deposited by a line-of-site deposition procession such as plasma spraying, aerosol deposition, electron beam ion assisted deposition (EB-IAD), plasma enhanced chemical vapor deposition (PE-CVD), or PVD. In some embodiments where the second plasma resistant layer is formed by plasma spraying or aerosol deposition, the multi-layer coating additionally includes a conformal third plasma resistant layer over the second plasma resistant layer and the first conformal plasma resistant layer.

The first plasma resistant layer may include $Y_2O_3$, $Al_2O_3$, $Er_2O_3$, $YF_3$, or Ni. The first plasma resistant layer may additionally include $Y_3Al_5O_{12}$ (YAG), $Er_3Al_5O_{12}$ (EAG), Y—O—F (e.g., $Y_5O_4F_7$), a solid solution of $Y_2O_3$—$ZrO_2$, or a ceramic compound comprising $Y_4Al_2O_9$ and a solid-solution of $Y_2O_3$—$ZrO_2$. In some embodiments, the first plasma resistant layer includes alternating sub-layers of a rare earth oxide (e.g., $Y_2O_3$) and another metal (e.g., $Al_2O_3$). The sub-layers of the rare earth oxide may be approximately 2-12 times thicker than the sub-layers of the additional metal in some embodiments. The second plasma resistant layer may include $Y_2O_3$, $Al_2O_3$, $Er_2O_3$, $Y_3Al_5O_{12}$, $Y_2O_3$, $Al_2O_3$, $YF_3$, $Er_3Al_5O_{12}$, Y—O—F (e.g., $Y_5O_4F_7$), a solid solution of $Y_2O_3$—$ZrO_2$, or a ceramic compound comprising $Y_4Al_2O_9$ and a solid-solution of $Y_2O_3$—$ZrO_2$. Any of the aforementioned plasma resistant ceramic coatings may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. In some embodiments, the conformal third plasma resistant layer is composed of $Y_2O_3$, $Al_2O_3$, $Er_2O_3$, $YF_3$, $Y_3Al_5O_{12}$, $Er_3Al_5O_{12}$, Y—O—F (e.g., $Y_5O_4F_7$), a solid solution of $Y_2O_3$—$ZrO_2$, or a ceramic compound comprising $Y_4Al_2O_9$ and a solid-solution of $Y_2O_3$—$ZrO_2$. The multi-layer ceramic coating allows for longer working lifetimes due to the plasma resistance of the ceramic coating and decreased on-wafer or substrate contamination.

In one embodiment, the processing chamber 100 includes a chamber body 102 and a showerhead 130 that enclose an interior volume 106. The showerhead 130 may or may not include a gas distribution plate. For example, the showerhead may be a multi-piece showerhead that includes a showerhead base and a showerhead gas distribution plate bonded to the showerhead base. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material. The chamber body 102 generally includes sidewalls 108 and a bottom 110. Any of the showerhead 130 (or lid and/or nozzle), sidewalls 108 and/or bottom 110 may include the multi-layer plasma resistant coating.

An outer liner 116 may be disposed adjacent the sidewalls 108 to protect the chamber body 102. The outer liner 116 may be a halogen-containing gas resist material such as $Al_2O_3$ or $Y_2O_3$. The outer liner 116 may be coated with the multi-layer plasma resistant ceramic coating in some embodiments.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewalls 108 of the chamber body 102 and/or on a top portion of the chamber body. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 includes multiple gas delivery holes 132 throughout the showerhead 130. The showerhead 130 may by aluminum, anodized aluminum, an aluminum alloy (e.g., Al 6061), or an anodized aluminum alloy. In some embodiments, the showerhead includes a gas distribution plate (GDP) bonded to the showerhead. The GDP may be, for example, Si or SiC. The GDP may additionally include multiple holes that line up with the holes in the showerhead.

Figure 1B:
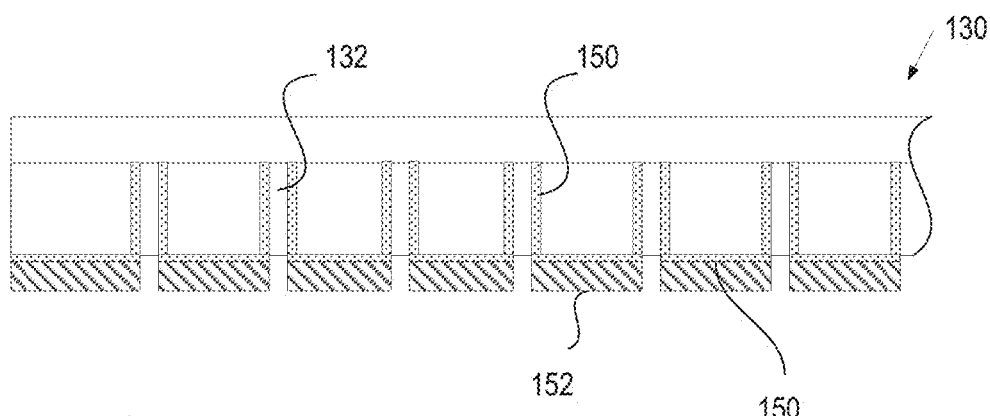
FIG. 1B depicts a sectional view of one embodiment of a showerhead for a processing chamber.

FIG. 1B illustrates a zoomed in view of a portion of the showerhead 130 of FIG. 1A. With reference to FIGS. 1A-1B, in embodiments the showerhead 130 is coated by the multi-layer plasma resistant coating. In particular, in some embodiments a surface of the showerhead and walls of holes 132 in the showerhead are coated by a thin conformal first plasma resistant layer 150 of the multi-layer plasma resistant coating. Additionally, the backside of the showerhead 130 and outer side walls of the showerhead may also be coated by the conformal first plasma resistant layer 150. A non-line of site deposition technique such as ALD or plating (e.g., electroplating) may be used to deposit the first plasma resistant layer 150 on the surface of the showerhead 130 and on the walls of the holes 132 in the showerhead 130. The first plasma resistant layer 150 may be $Y_2O_3$, $Al_2O_3$, $Er_2O_3$, $YF_3$, $Er_3Al_5O_{12}$, Y—O—F (e.g., $Y_5O_4F_7$), $Y_3Al_5O_{12}$, a solid solution of $Y_2O_3$—$ZrO_2$, a ceramic compound comprising $Y_4Al_2O_9$ and a solid-solution of $Y_2O_3$—$ZrO_2$, or Ni. In some embodiments, the first plasma resistant layer 150 includes alternating sub-layers of a rare earth oxide (e.g., $Y_2O_3$) and another metal oxide (e.g., $Al_2O_3$). The sub-layers of the rare earth oxide may be approximately 2-12 times thicker than the sub-layers of the additional metal oxide in some embodiments. The first plasma resistant layer 150 may have a zero porosity, may be conformal, and may have a thickness of about 100 nm to about 10 microns or about 200 nm to about 1 micron in embodiments.

In some embodiments, an additional conformal layer (not shown) may be deposited by ALD or plating (e.g., electroplating) prior to deposition of the first plasma resistant layer 150. The additional conformal layer may be an amorphous material such as $Al_2O_3$ and may be a stress relief layer that mitigates cracking in the first plasma resistant layer 150 during thermal cycling. The additional conformal layer may have a zero porosity and may have a thickness of about 100 nm to about 10 microns or about 200 nm to about 1 micron in embodiments.

A second plasma resistant layer 152 of the multi-layer plasma resistant coating covers the first plasma resistant layer 150 at some or all regions of the surface of the showerhead 130. However, the second plasma resistant layer 152 is deposited using a line-of-site deposition technique such as PE-CVD, EB-IAD, aerosol deposition or plasma spraying. Accordingly, the second plasma resistant layer 152 does not coat the walls of the holes in the showerhead 130. It should be noted that in some embodiments a portion of the walls of the holes 132 near the surface of the showerhead 130 are coated by the second plasma resistant layer 152. However, in such embodiments the second plasma resistant layer 152 does not extend more than to a depth of about 1-1.5 times a diameter of the hole. In one embodiment, the diameter of the holes 132 is about 0.1-0.25 inches. Accordingly, the phrase "a conformal second plasma resistant layer that covers the conformal first plasma resistant layer at a region of the surface but not at the walls of the plurality of high aspect ratio features" is interpreted to cover both embodiments where no portion of the walls of the high aspect ratio features are coated by the second plasma resistant layer and embodiments where a small portion of the walls of the high aspect ratio features that are near a surface of an article are at least partially coated by the second plasma resistant layer. The second plasma resistant layer 152 may include $Y_2O_3$, $Al_2O_3$, $Er_2O_3$, $Y_3Al_5O_{12}$, $Y_2O_3$, $Al_2O_3$, $YF_3$, $Er_3Al_5O_{12}$, Y—O—F (e.g., $Y_5O_4F_7$), a solid solution of $Y_2O_3$—$ZrO_2$, or a ceramic compound comprising $Y_4Al_2O_9$ and a solid-solution of $Y_2O_3$—$ZrO_2$. If the second plasma resistant layer 152 is a plasma sprayed layer or a layer deposited by aerosol deposition, then it may have a thickness of about 4-20 mils (e.g., 5-10 mils) in embodiments. If the second plasma resistant layer 152 is an EB-IAD layer or a PE-CVD layer, then it may have a thickness of about 1-10 microns in embodiments.

In some embodiments, a conformal third plasma resistant layer covers the second plasma resistant layer 152. Additionally, the conformal third plasma resistant layer covers the first plasma resistant layer 152 on the holes 132 as well as on a backside of the showerhead 130 and on outer side walls of the showerhead 130. The conformal third plasma resistant layer may be composed of any of the materials described above with reference to the first plasma resistant layer 150.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). The fluorine based gases may cause fluoride deposits to buildup on the holes of standard showerheads. However, the holes 132 of showerhead 130 may be resistant to such fluoride buildup due to the multi-layer plasma resistant coating (and in particular to the first plasma resistant layer 150 that coats the walls of the holes 132).

A substrate support assembly 148 is disposed in the interior volume 106 of the processing chamber 100 below the showerhead 130. The substrate support assembly 148 holds a substrate 144 (e.g., a wafer) during processing. The substrate support assembly 148 may include an electrostatic chuck that secures the substrate 144 during processing, a metal cooling plate bonded to the electrostatic chuck, and/or one or more additional components. An inner liner may cover a periphery of the substrate support assembly 148. The inner liner may be a halogen-containing gas resist material such as $Al_2O_3$ or $Y_2O_3$. The substrate support assembly, portions of the substrate support assembly, and/or the inner liner may be coated with the multi-layer plasma resistant ceramic coating in some embodiments.

Figure 2:
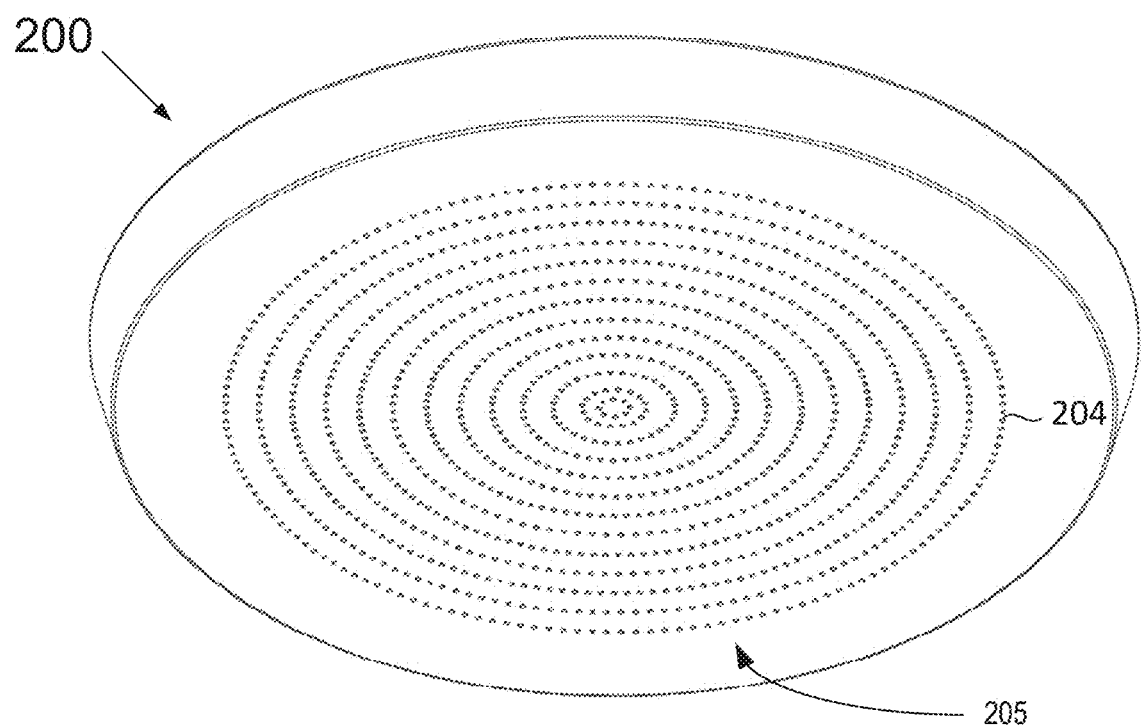
FIG. 2 illustrates a perspective view of a bottom of a showerhead for a processing chamber.

FIG. 2 illustrates one embodiment of a bottom view of a showerhead 200. The showerhead 200 may have a series of gas conduits 204 (also referred to as holes) arranged concentrically that evenly distribute plasma gasses directly over a substrate or wafer to be etched. The showerhead is depicted here having approximately 1100 gas conduits 204 arranged in evenly distributed concentric rings for even distributing of gasses. In another embodiment, the gas conduits 204 may be configured in alternative geometric configurations on the lower surface 205 of the showerhead (or on a lower surface of a GDP bonded to a showerhead). For example, the showerhead may have a square or rectangular configuration having rows and columns of gas conduits 204. It is to be understood that other shapes (e.g., triangle, pentagon, etc.) may be implemented and coated with a ceramic coating (e.g., an HPM coating) as described above. The showerhead 200 can have many gas conduits 204, as depicted, or as few gas conduits as appropriate depending on the type of reactor and/or process utilized.

In one embodiment, some or all gas conduits 204 do not include branches (e.g., each gas conduit may have a single entry point and a single exit point). Additionally, the gas conduits may have various lengths and orientation angles. Gas may be delivered to the gas conduits 204 via one or more gas delivery nozzles. Some gas conduits 204 may receive the gas before other gas conduits 204 (e.g., due to a proximity to a gas delivery nozzle). However, the gas conduits 204 may be configured to deliver gas to a substrate resting beneath the showerhead at approximately the same time based on varying the orientation angles, diameters and/or lengths of the gas conduits 204, or by using an additional flow equalizer. For example, gas conduits 204 that will receive gas first may be longer and/or have a greater angle (e.g., an angle that is further from 90 degrees) than conduits that will receive gas later.

Figure 3:
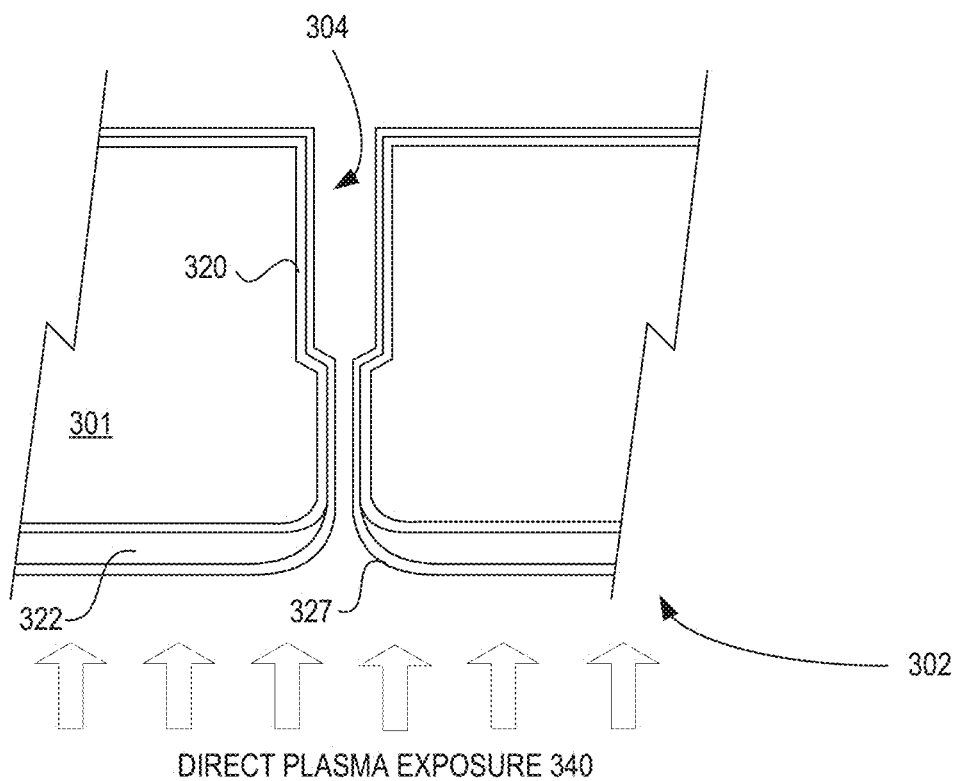
FIG. 3 is a cross-sectional view of one embodiment of a gas conduit of a showerhead for a processing chamber.

FIG. 3 is a cross-sectional diagram illustrating one embodiment of a gas conduit 304 of a showerhead (or GDP) 301 for a processing chamber. The gas conduit 304, in one embodiment, fluidly couples one end of the showerhead (e.g., an end that connects with a plenum area of the showerhead) with a lower surface 302 of the showerhead 301. A first plasma resistant layer 320 of a multi-layer plasma resistant coating coats the lower surface 302 of the showerhead 301 and additionally coats walls of the gas conduit 304 and a backside of the showerhead 301. Additionally, a second plasma resistant layer 322 of the multi-layer plasma resistant coating covers the first plasma resistant layer 320 at the lower surface 302 and partially on the side walls of the gas conduit 304. However, the second plasma resistant layer 322 does not extend into the gas conduit 304. Accordingly, the second plasma resistant layer 322 is considered not to coat the walls of the gas conduit 304. Additionally, a third plasma resistant layer 327 covers the second plasma resistant layer 322 on the lower surface 302. The third plasma resistant layer 327 additionally covers the first plasma resistant layer 320 on the walls of the gas conduit 304 and on the backside of the showerhead 301.

Some or all gas conduits 304 may comprise an upper region and a narrower lower region. The narrower lower region helps promote even gas flow across all gas conduits 304 by restricting the rate at which gas may flow through the gas conduit 304. This may result in an evenly distributed gas flow through the various gas conduits 304.

As shown, the lower surface 302 is subject to direct plasma exposure 340. The second plasma resistant layer 322 on the lower surface 302 provides additional protection from the direct plasma exposure 340 beyond the protection provided by the first plasma resistant layer 320 and the third plasma resistant layer 327.

Figure 4:
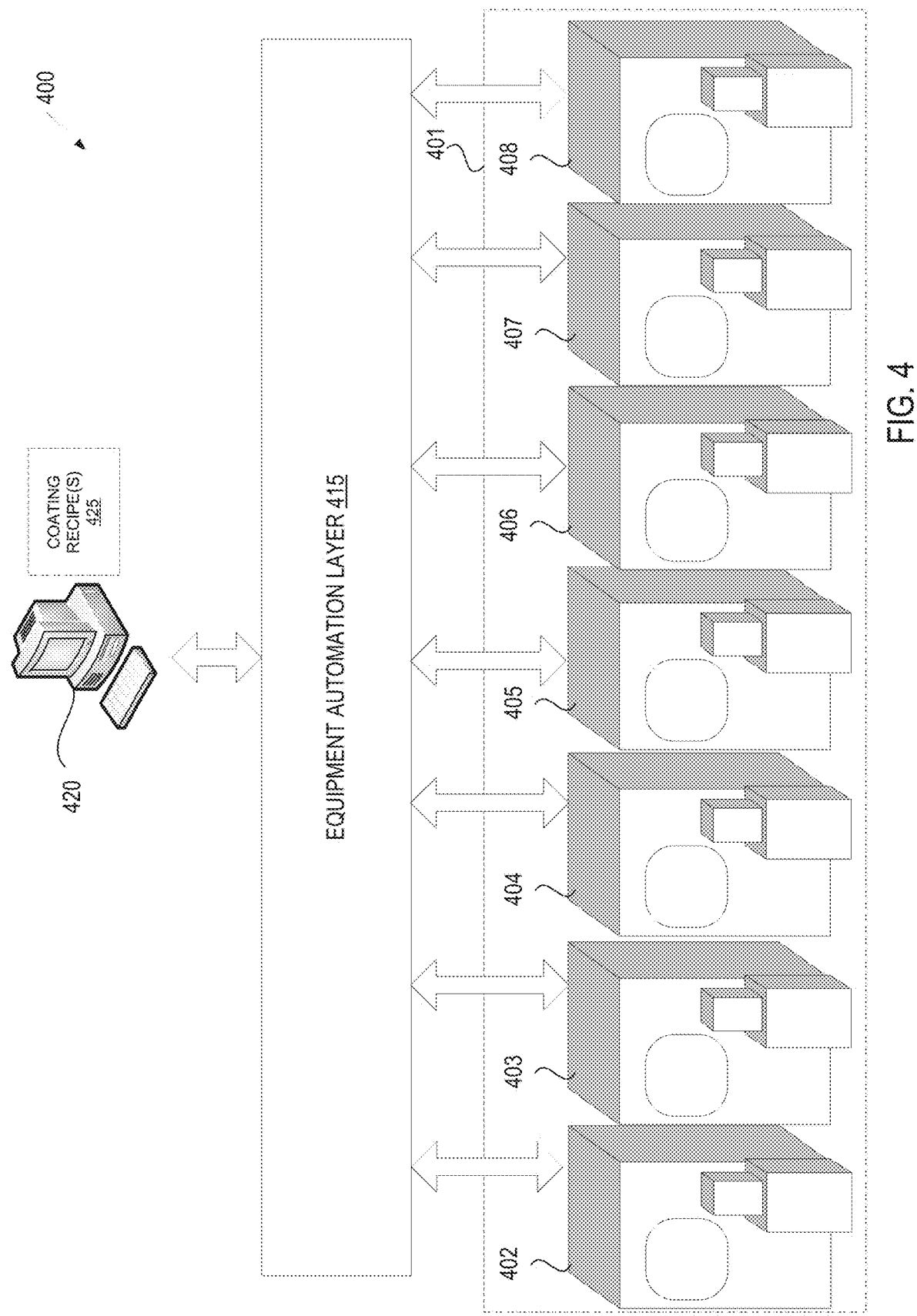
FIG. 4 illustrates an example architecture of a manufacturing system, in accordance with embodiments of the present invention.

FIG. 4 illustrates an example architecture of a manufacturing system 400. The manufacturing system 400 may be a manufacturing system for applying coatings to articles. In one embodiment, the manufacturing system 400 includes manufacturing machines 401 (e.g., processing equipment) connected to an equipment automation layer 415. The manufacturing machines 401 may include a bead blaster 402, one or more wet cleaners 403, a plasma spraying system 404, an atomic layer deposition (ALD) system 405, an EB-IAD system 406, a PE-CVD system 407, an electroplating system 408, another type of plating system (not shown) and/or an aerosol deposition system (not shown). The manufacturing system 400 may further include one or more computing device 420 connected to the equipment automation layer 415. In alternative embodiments, the manufacturing system 400 may include more or fewer components. For example, the manufacturing system 400 may include manually operated (e.g., off-line) manufacturing machines 401 without the equipment automation layer 415 or the computing device 420.

Bead blaster 402 is a machine configured to roughen the surface of articles such as chamber components for processing chambers. Bead blaster 402 may be a bead blasting cabinet, a hand held bead blaster, or other type of bead blaster. Bead blaster 402 may roughen a substrate by bombarding the substrate with beads or particles. In one embodiment, bead blaster 402 fires ceramic beads or particles at the substrate. Examples of ceramic beads that may be used include SiC beads and $Al_2O_3$ beads. The ceramic beads may have an average diameter of about 1-5 microns (e.g., 1-3 microns). The roughness achieved by the bead blaster 402 may be based on a force used to fire the beads, bead materials, bead sizes, distance of the bead blaster from the substrate, processing duration, and so forth.

In alternative embodiments, other types of surface rougheners than a bead blaster 402 may be used. For example, a motorized abrasive pad may be used to roughen the surface of ceramic substrates. A sander may rotate or vibrate the abrasive pad while the abrasive pad is pressed against a surface of the article. A roughness achieved by the abrasive pad may depend on an applied pressure, on a vibration or rotation rate and/or on a roughness of the abrasive pad.

Wet cleaners 403 are cleaning apparatuses that clean articles (e.g., articles) using a wet clean process. Wet cleaners 403 include wet baths filled with liquids, in which the substrate is immersed to clean the substrate. Wet cleaners 403 may agitate the wet bath using ultrasonic waves during cleaning to improve a cleaning efficacy. This is referred to herein as sonicating the wet bath.

In some embodiments, wet cleaners 403 include a first wet cleaner that contains deionized (DI) water and a second wet cleaner that contains an acid solution. The acid solution may be a hydrofluoric acid (HF) solution, a hydrochloric acid (HCl) solution, a nitric acid ($HNO_3$) solution, or combination thereof in embodiments. The acid solution may remove surface contaminants from the article and/or may remove an oxide from the surface of the article. Cleaning the article with the acid solution prior to performing ALD may improve a quality of a coating deposited using ALD. In one embodiment, an acid solution containing approximately 0.1-5.0 vol % HF is used to clean chamber components made of quartz. In one embodiment, an acid solution containing approximately 0.1-20 vol % HCl is used to clean articles made of $Al_2O_3$. In one embodiment, an acid solution containing approximately 5-15 vol % $HNO_3$ is used to clean articles made of aluminum and other metals.

The wet cleaners 103 may clean articles at multiple stages during processing. For example, wet cleaners 103 may clean an article after a substrate has been roughened and before performing ALD or plating (e.g., electroplating), after a first plasma resistant ceramic layer has been applied to an article, after a second plasma resistant layer has been applied to an article, and so forth.

In other embodiments, alternative types of cleaners such as dry cleaners may be used to clean the articles. Dry cleaners may clean articles by applying heat, by applying gas, by applying plasma, and so forth.

Plasma spraying system 404 is a machine configured to plasma spray a ceramic coating to the surface of an article. Plasma spraying system 404 may be a low pressure plasma spraying (LPPS) system or an atmospheric pressure plasma spraying (APPS) system. Both LPPS systems and APPS systems may be used to deposit a porous, low density plasma resistant layer (e.g., a second plasma resistant layer for a multi-layer plasma resistant coating). An LPPS includes a vacuum chamber that can be pumped down to reduced pressure (e.g., to a vacuum of 1 Mbar, 10 Mbar, 35 Mbar, etc.), while an APPS system does not include any vacuum chamber, and may instead include an open chamber or room.

In a plasma spraying system 404, an arc is formed between two electrodes through which a gas is flowing. As the gas is heated by the arc, the gas expands and is accelerated through a shaped nozzle of a plasma torch, creating a high velocity plasma jet. Powder composed of a ceramic and/or metal material is injected into the plasma jet by a powder delivery system. An intense temperature of the plasma jet melts the powder and propels the molten ceramic and/or metal material towards an article. Upon impacting with the article, the molten powder flattens, rapidly solidifies, and forms a layer of a ceramic coating that adheres to the article. The parameters that affect the thickness, density, and roughness of the plasma sprayed layer include type of powder, powder size distribution, powder feed rate, plasma gas composition, gas flow rate, energy input, pressure, and torch offset distance. The plasma sprayed layer may have a porosity of about 1-5% in embodiments (e.g., a porosity of 2%, 3%, 4%, etc.). Porosity is a measure of a void (e.g., empty space) in a material, and is a fraction of the volume of voids over the total volume or the material.

ALD system 405 is a system that performs atomic layer deposition to form a thin dense conformal layer on an article. ALD allows for a controlled self-limiting deposition of material through chemical reactions with the surface of the article. Aside from being a conformal process, ALD is also a uniform process. All exposed sides of the article, including high aspect ratio features (e.g., about 10:1 to about 300:1) will have the same or approximately the same amount of material deposited. A typical reaction cycle of an ALD process starts with a precursor (i.e., a single chemical A) flooded into an ALD chamber and adsorbed onto the surface of the article. The excess precursor is then flushed out of the ALD chamber before a reactant (i.e., a single chemical R) is introduced into the ALD chamber and subsequently flushed out. This process may be repeated to build up an ALD layer having a thickness of up to about 1 micron in some embodiments.

Unlike other techniques typically used to deposit coatings on articles, such as plasma spray coating and ion assisted deposition, the ALD technique can deposit a layer of material within high aspect ratio features (i.e., on the surfaces of the features). Additionally, the ALD technique produces relatively thin (i.e., 1 μm or less) coatings that are porosity-free (i.e., pin-hole free), which may eliminate crack formation during deposition. The term "porosity-free" as used herein means absence of any pores, pin-holes, voids, or cracks along the whole depth of the coating as measured by transmission electron microscopy (TEM).

The precursors used by the ALD system 405 to form a plasma resistant layer depend on the plasma resistant layer that is formed. In some embodiments, the plasma resistant layer is $Al_2O_3$, and is formed from an aluminum precursor such as diethylaluminum ethoxide, tris(ethylmethylamido) aluminum, aluminum sec-butoxide, aluminum tribromide, aluminum trichloride, triethylaluminum, triisobutylaluminum, trimethylaluminum, or tris(diethylamido)aluminum. In some embodiments, the plasma resistant layer is $Y_2O_3$ or $YF_3$, and is formed from an yttrium precursor such as tris(N,N-bis(trimethylsilyl)amide)yttrium (III), tris(2,2,6,6-tetramethyl-3,5-heptanedionato)yttrium(III) or yttrium (III) butoxide. In some embodiments, the plasma resistant layer is $Er_2O_3$, and is formed from an erbium precursor such as tris-methylcyclopentadienyl erbium(III) ($Er(MeCp)_3$), erbium boranamide ($Er(BA)_3$), $Er(TMHD)_3$, erbium(III)tris (2,2,6,6-tetramethyl-3,5-heptanedionate), and tris(butylcyclopentadienyl)erbium(III).

The reactants that are used by the ALD system 405 to form the plasma resistant layer may be oxygen, water vapor, ozone, pure oxygen, oxygen radicals, or another oxygen source if the deposited plasma resistant layer is an oxide. The reactants may be a fluoride (e.g., $TiF_4$) if a $YF_3$ plasma resistant layer is to be formed.

The EB-IAD system 406 is a system that performs electron beam ion assisted deposition. Alternatively, other types of IAD systems may be used in embodiments, such as activated reactive evaporation ion assisted deposition (ARE-IAD) or ion beam sputtering ion assisted deposition (IBS-IAD). EB-IAD may be performed by evaporation. IBS-IAD may be performed by sputtering a solid target material (e.g., a solid metal target). Any of the IAD methods may be performed in the presence of a reactive gas species, such as $O_2$, $N_2$, halogens, etc.

For the various types of IAD, a thin film plasma resistant layer is formed by an accumulation of deposition materials in the presence of energetic particles such as ions. The deposition materials include atoms, ions, radicals, or their mixture. The energetic particles may impinge and compact the thin film plasma resistant layer as it is formed.

For IAD, a material source provides a flux of deposition materials while an energetic particle source provides a flux of the energetic particles, both of which impinge upon an article throughout the IAD process. The energetic particle source may be an Oxygen or other ion source. The energetic particle source may also provide other types of energetic particles such as radicals, atoms, ions, and nano-sized particles which come from particle generation sources (e.g., from plasma, reactive gases or from the material source that provide the deposition materials). The material source (e.g., a target body) used to provide the deposition materials may be a bulk sintered ceramic corresponding to the same ceramic that the plasma resistant layer is to be composed of.

IAD may utilize one or more plasmas or beams to provide the material and energetic ion sources. Reactive species may also be provided during deposition of the plasma resistant coating. With IAD processes, the energetic particles may be controlled by the energetic ion (or other particle) source independently of other deposition parameters. The energy (e.g., velocity), density and incident angle of the energetic ion flux may be selected to achieve a target composition, structure, crystalline orientation and grain size of the plasma resistant layer. Additional parameters that may be adjusted are a temperature of the article during deposition as well as the duration of the deposition. EB-IAD and IBS-IAD depositions are feasible on a wide range of surface conditions. However, IAD performed on polished surfaces may achieve increased breakdown voltages.

PE-CVD system 407 is a system that performs PE-CVD to deposit thin films from a vapor to a solid on a substrate. PE-CVD involves chemical reactions that occur after the creation of a plasma. The plasma may be created by a radio frequency (RF) or direct frequency (DC) discharge between two electrodes in a chamber filled with reactant gases. PE-CVD produces thin dense films similar to those produced by EB-IAD and other IAD processes.

Electroplating system 408 is a system that performs electroplating (e.g., of Ni). Electroplating is the process of plating one metal onto another by hydrolysis. Electroplating system 408 applies a current to reduce dissolved metal cations so that they form a thin coherent metal coating on the article. Specifically, the article to be plated may be the cathode of a circuit and a metal donor may be the anode of the circuit. The article and metal donor may be immersed in an electrolyte containing one or more dissolved metal salts and/or other ions that increase an electrical conductivity of the electrolyte. Metal from the metal donor than plates a surface of the article.

Another type of plating system that may be used is an electroless plating system that performs electroless plating. Electroless plating, also known as chemical or auto-catalytic plating, is a non-galvanic plating method that involves several simultaneous reactions in an aqueous solution, which occur without the use of external electrical power. The reaction is accomplished when hydrogen is released by a reducing agent, normally sodium hypophosphite or thiourea, and oxidized, thus producing a negative charge on the surface of the part.

The equipment automation layer 415 may interconnect some or all of the manufacturing machines 401 with computing devices 420, with other manufacturing machines, with metrology tools and/or other devices. The equipment automation layer 415 may include a network (e.g., a location area network (LAN)), routers, gateways, servers, data stores, and so on. Manufacturing machines 401 may connect to the equipment automation layer 415 via a SEMI Equipment Communications Standard/Generic Equipment Model (SECS/GEM) interface, via an Ethernet interface, and/or via other interfaces. In one embodiment, the equipment automation layer 415 enables process data (e.g., data collected by manufacturing machines 401 during a process run) to be stored in a data store (not shown). In an alternative embodiment, the computing device 420 connects directly to one or more of the manufacturing machines 401.

In one embodiment, some or all manufacturing machines 401 include a programmable controller that can load, store and execute process recipes. The programmable controller may control temperature settings, gas and/or vacuum settings, time settings, etc. of manufacturing machines 401. The programmable controller may include a main memory (e.g., read-only memory (ROM), flash memory, dynamic random access memory (DRAM), static random access memory (SRAM), etc.), and/or a secondary memory (e.g., a data storage device such as a disk drive). The main memory and/or secondary memory may store instructions for performing heat treatment processes described herein.

The programmable controller may also include a processing device coupled to the main memory and/or secondary memory (e.g., via a bus) to execute the instructions. The processing device may be a general-purpose processing device such as a microprocessor, central processing unit, or the like. The processing device may also be a special-purpose processing device such as an application specific integrated circuit (ASIC), a field programmable gate array (FPGA), a digital signal processor (DSP), network processor, or the like. In one embodiment, programmable controller is a programmable logic controller (PLC).

In one embodiment, the manufacturing machines 401 are programmed to execute recipes that will cause the manufacturing machines to roughen an article, clean an article, coat an article, and so on. In one embodiment, the manufacturing machines 401 are programmed to execute recipes that perform operations of a multi-step process for manufacturing an article having a multi-layer plasma resistant coating, as described with reference to FIGS. 5-6. The computing device 420 may store one or more coating, cleaning and/or roughening recipes 425 that can be downloaded to the manufacturing machines 401 to cause the manufacturing machines 401 to manufacture articles in accordance with embodiments of the present disclosure.

Figure 5:
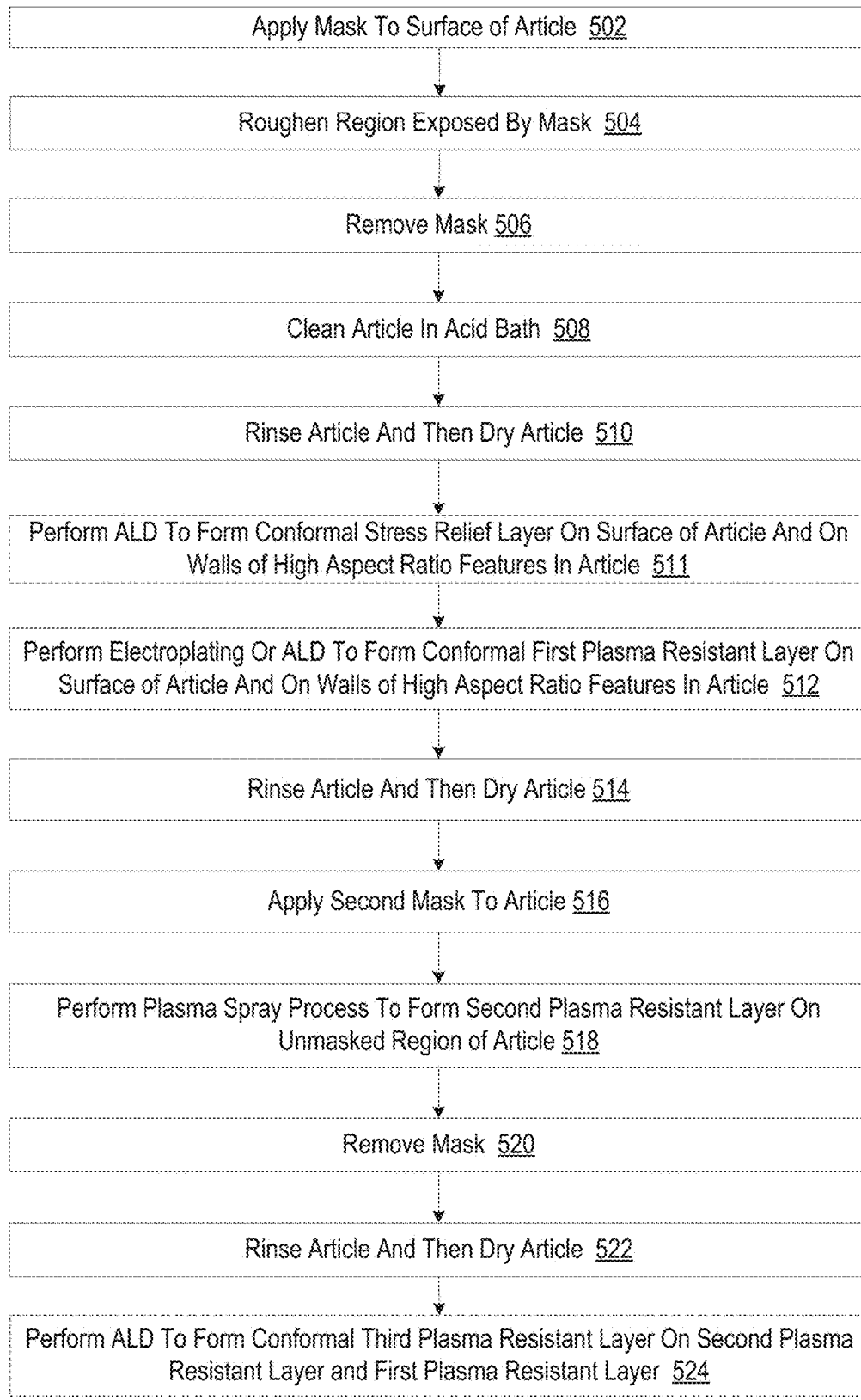
FIG. 5 illustrates one embodiment of a process for forming a multi-layer plasma resistant coating on a chamber component.

FIG. 5 illustrates one embodiment of a process 500 for forming a multi-layer plasma resistant coating on a chamber component. Process 500 may be performed using one or more of the manufacturing machines 401 of FIG. 4. At block 502 of process 500 a mask may be applied to a surface of an article. The article may be any article discussed herein, such as a showerhead or other chamber component for a processing chamber. The mask may expose a region of a surface of the article that will be roughened and may cover portions of the article that will not be roughened. The region of the article that will be roughened may be a region that is in direct exposure to plasma when the article is installed in a processing chamber and the processing chamber is in use. At block 504 a roughening process such as bead blasting is performed to roughen the exposed region of the surface of the article. In one embodiment, the exposed region of the surface is roughened to an average surface roughness of about 200-300 micro-inches (e.g., 220 micro-inches). In other embodiments, the exposed region may be roughened to an average surface roughness of 50-300 micro-inches, 50-200 micro-inches, 100-200 micro-inches, 150-400 micro-inches, 200-240 micro-inches, or other surface roughnesses.

At block 506, the mask is removed from the article. At block 508, the article is cleaned in an acid solution. The acid solution may be a hydrofluoric acid (HF) solution, a hydrochloric acid (HCl) solution, a nitric acid ($HNO_3$) solution, or combination thereof in embodiments. The acid solution may remove surface contaminants from the article and/or may remove an oxide from the surface of the article. Cleaning the article with the acid solution prior to performing ALD may improve a quality of a coating deposited using ALD. In one embodiment, an acid solution containing approximately 0.1-5.0 vol % HF is used to clean chamber components made of quartz. In one embodiment, an acid solution containing approximately 0.1-20 vol % HCl is used to clean articles made of $Al_2O_3$. In one embodiment, an acid solution containing approximately 5-15 vol % $HNO_3$ is used to clean articles made of aluminum and other metals.

At block 510, the article is rinsed in DI water. The DI water may be agitated by applying ultrasonic waves to the DI water during the rinse to help removal of particles from the article. The article is then dried by applying heat to the article (e.g., by heating the article to a temperature of about 120-300° C. for 10 minutes to 3 hours).

At block 511, ALD may be performed to form a conformal stress relief layer on the surface of the article and on walls of high aspect ratio features in the article. The conformal stress relief layer may also cover a backside of the article and outer side walls of the article. The conformal stress relief layer may be $Al_2O_3$ or another amorphous material. Preferably the conformal stress relief layer has a coefficient of thermal expansion (CTE) that is close to a CTE of the article, or that is between a CTE of the article and a CTE of a later deposited conformal first plasma resistant layer. The conformal stress relief layer may be deposited to a thickness of about 100 nm to about 10 microns in embodiments. In other embodiments the conformal stress relief layer may be thinner, and may have a thickness of about 10 nm to about 200 nm. Some possible thicknesses of the conformal stress relief layer are 10 nm, 20 nm, 50 nm, 80 nm, 100 nm, 150 nm, 200 nm, 300 nm, 400 nm, 500 nm, 600 nm, 700 nm, 800 nm, 900 nm and 1 micron.

At block 512, electroplating, electroless plating or ALD is performed to form a conformal first plasma resistant layer on a surface of the article and on walls of high aspect ratio features of the article (e.g., features having aspect ratios of 3:1, 5:1, 10:1, 20:1, 50:1, 100:1, 200:1, 300:1, and so on). The first plasma resistant layer may also cover a backside of the article and outer side walls of the article. ALD, electroless plating and electroplating are non-line-of-site deposition processes that are able to coat the high aspect ratio features of the article. In some embodiments the article may not have high aspect ratio features and the plating or ALD forms the conformal first plasma resistant layer on the surface of the article. The first plasma resistant layer may be deposited to a thickness of about 100 nm to about 10 microns in embodiments. In other embodiments the first plasma resistant layer may be thinner, and may have a thickness of about 10 nm to about 200 nm. Some possible thicknesses of the first plasma resistant layer are 10 nm, 20 nm, 50 nm, 80 nm, 100 nm, 150 nm, 200 nm, 300 nm, 400 nm, 500 nm, 600 nm, 700 nm, 800 nm, 900 nm and 1 micron. If plating is performed, then the first plasma resistant layer may be composed of Ni. If ALD is performed, then the first plasma resistant layer may be composed of $Y_2O_3$, $Al_2O_3$, $Er_2O_3$ and/or $YF_3$. The first plasma resistant layer may additionally include $Y_3Al_5O_{12}$, $Er_3Al_5O_{12}$, Y—O—F (e.g., $Y_5O_4F_7$), a solid solution of $Y_2O_3$—$ZrO_2$, or a ceramic compound comprising $Y_4Al_2O_9$ and a solid-solution of $Y_2O_3$—$ZrO_2$ if ALD is performed. The first plasma resistant layer may have a porosity of effectively 0%.

With reference to the solid-solution of $Y_2O_3$—$ZrO_2$, the first plasma resistant layer may include $Y_2O_3$ at a concentration of 10-90 molar ratio (mol %) and $ZrO_2$ at a concentration of 10-90 mol %. In some examples, the solid-solution of $Y_2O_3$—$ZrO_2$ may include 10-20 mol % $Y_2O_3$ and 80-90 mol % $ZrO_2$, may include 20-30 mol % $Y_2O_3$ and 70-80 mol % $ZrO_2$, may include 30-40 mol % $Y_2O_3$ and 60-70 mol % $ZrO_2$, may include 40-50 mol % $Y_2O_3$ and 50-60 mol % $ZrO_2$, may include 60-70 mol % $Y_2O_3$ and 30-40 mol % $ZrO_2$, may include 70-80 mol % $Y_2O_3$ and 20-30 mol % $ZrO_2$, may include 80-90 mol % $Y_2O_3$ and 10-20 mol % $ZrO_2$, and so on.

With reference to the ceramic compound comprising $Y_4Al_2O_9$ and a solid-solution of $Y_2O_3$—$ZrO_2$, in one embodiment the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0.1-60 mol % and $Al_2O_3$ in a range of 0.1-10 mol %. In another embodiment, the ceramic compound can include $Y_2O_3$ in a range of 40-60 mol %, $ZrO_2$ in a range of 30-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 70-90 mol %, $ZrO_2$ in a range of 0.1-20 mol % and $Al_2O_3$ in a range of 10-20 mol %. In another embodiment, the ceramic compound can include $Y_2O_3$ in a range of 60-80 mol %, $ZrO_2$ in a range of 0.1-10 mol % and $Al_2O_3$ in a range of 20-40 mol %. In another embodiment, the ceramic compound can include $Y_2O_3$ in a range of 40-60 mol %, $ZrO_2$ in a range of 0.1-20 mol % and $Al_2O_3$ in a range of 30-40 mol %. In other embodiments, other distributions may also be used for the ceramic compound.

In one embodiment, the first plasma resistant layer includes alternating sub-layers of a rare earth oxide (e.g., $Y_2O_3$) and another metal oxide (e.g., $Al_2O_3$) formed by ALD. The sub-layers of the rare earth oxide may be approximately 2-12 times thicker than the sub-layers of the additional metal in some embodiments. Some example thickness ratios of the rare earth oxide sub-layers to the additional metal oxide sub-layers include 2:1, 3:1, 4:1, 5:1, 8:1, 10:1 and 12:1. In some embodiments, sub-layers of the rare earth metal oxide are formed using about 5-12 cycles of an ALD process, where each cycle forms a nanolayer (or slightly less or more than a nanolayer) of the rare earth metal-containing oxide. Each layer of the other metal oxide may be formed from a single ALD cycle (or a few ALD cycles) and may have a thickness of less than an atom to a few atoms. Layers of the rare earth metal-containing oxide may each have a thickness of about 5-100 angstroms, and layers of the additional metal oxide may each have a thickness of about 1-20 angstroms in embodiments. The additional metal oxide sub-layers prevent the rare earth oxide sub-layers from becoming crystalline in embodiments. As a result of the additional metal oxide sub-layers, the rare earth oxide sub-layers remain in a polycrystalline state.

The first plasma resistant layer is a highly conformal layer. As a result, the average surface roughness of the first plasma resistant layer is approximately the same (or nearly the same) as the surface roughness of the surface of the article that was coated. Accordingly, the surface roughness of the first plasma resistant layer at the region of the article that was roughened has the surface roughness of about 200-300 micro-inches (or the other surface roughness that was achieved by the roughening process). The first plasma resistant layer does not rely on the surface roughness of the article for adhesion to the article. However, a later deposited second plasma resistant layer may rely on surface roughness for adhesion. It was discovered that roughening the surface of the first plasma resistant layer resulted in a shorter life span of the article and in some instances damaged the first plasma resistant layer. Accordingly, by first roughening the article prior to deposition of the first plasma resistant layer and using a highly conformal deposition process for the first plasma resistant layer, the surface of the first plasma resistant layer could have an increased surface roughness without performing any surface roughening of the first plasma resistant layer.

At block 514, the article is rinsed in DI water and then dried, similar to the process of block 510. The DI water may be agitated by applying ultrasonic waves to the DI water during the rinse. An acid clean may not be performed after the plating or ALD so as not to damage the first plasma resistant layer.

At block 516, a second mask is applied to the article. The second mask may cover those portions of the article that were covered by the first mask and may expose the same region of the article that was exposed by the first mask. The second mask may, for example, cover high aspect ratio features of the article such as holes (e.g., gas conduits) that terminate at the surface of the article.

At block 518, a plasma spray process or aerosol deposition process is performed to form a second plasma resistant layer over the first plasma resistant layer at the unmasked region of the article. The second plasma resistant layer may have a thickness of about 4-20 mils (e.g., 5 mils, 6 mils, 7 mils, 8 mils, 9 mils, etc.). The second plasma resistant layer may be composed of $Y_2O_3$, $Al_2O_3$, $Er_2O_3$, $Y_3Al_5O_{12}$, $Y_4Al_2O_9$, $Y_2O_3$, $Al_2O_3$, $YF_3$, $Er_3Al_5O_{12}$, Y—O—F (e.g., $Y_5O_4F_7$), a solid solution of $Y_2O_3$—$ZrO_2$, or a ceramic compound comprising $Y_4Al_2O_9$ and a solid-solution of $Y_2O_3$—$ZrO_2$. The second plasma resistant layer may have a porosity of about 1-5%.

At block 520, the second mask is removed from the article. At block 522, the article may be rinsed using DI water and then dried. The DI water may be agitated by applying ultrasonic waves to the DI water during the rinse. An acid clean may not be performed after the plasma spraying or aerosol deposition process so as not to damage the first plasma resistant layer or second plasma resistant layer. A breakdown voltage of at least 500 V/mil may be achieved for the article having a multi-layer coating that comprises the first and second plasma resistant layers. In one embodiment, the breakdown voltage is 500-1000 V/mil.

At block 524, ALD may be performed to form a conformal third plasma resistant layer over the second plasma resistant layer and over the first plasma resistant layer. The third plasma resistant layer may cover the second plasma resistant layer at the region of the article covered by the second plasma resistant layer. At the additional regions not covered by the second plasma resistant layer (e.g., the walls of high aspect ratio features such as holes, the backside of the article, etc.), the third plasma resistant layer covers the first plasma resistant layer. The third plasma resistant layer may be composed of $Y_2O_3$, $Al_2O_3$, $Er_2O_3$, $Y_3Al_5O_{12}$, $Y_4Al_2O_9$, $Y_2O_3$, $Al_2O_3$, $YF_3$, $Er_3Al_5O_{12}$, Y—O—F (e.g., $Y_5O_4F_7$), a solid solution of $Y_2O_3$—$ZrO_2$, or a ceramic compound comprising $Y_4Al_2O_9$ and a solid-solution of $Y_2O_3$—$ZrO_2$. The third plasma resistant layer may have the same material properties of the first plasma resistant layer in embodiments. For example, the third plasma resistant layer may have a porosity of less than 1% (e.g., less than 0.1% or 0%), and may have the same plasma resistance properties as the first plasma resistant layer. The third plasma resistant layer may act as a capping layer that fills in pores and cracks in the second plasma resistant layer and that seals in particles and/or other surface defects of the second plasma resistant layer. The third plasma resistant layer may have a thickness of about 100 nm to about 1 µm in embodiments. A breakdown voltage of at least 500 V/mil may be achieved for the article having a multi-layer coating that comprises the first, second and third plasma resistant layers. In one embodiment, the breakdown voltage is 500-1000 V/mil.

Alternatively, plating may be performed to form a conformal third plasma resistant layer of nickel.

Figure 6:
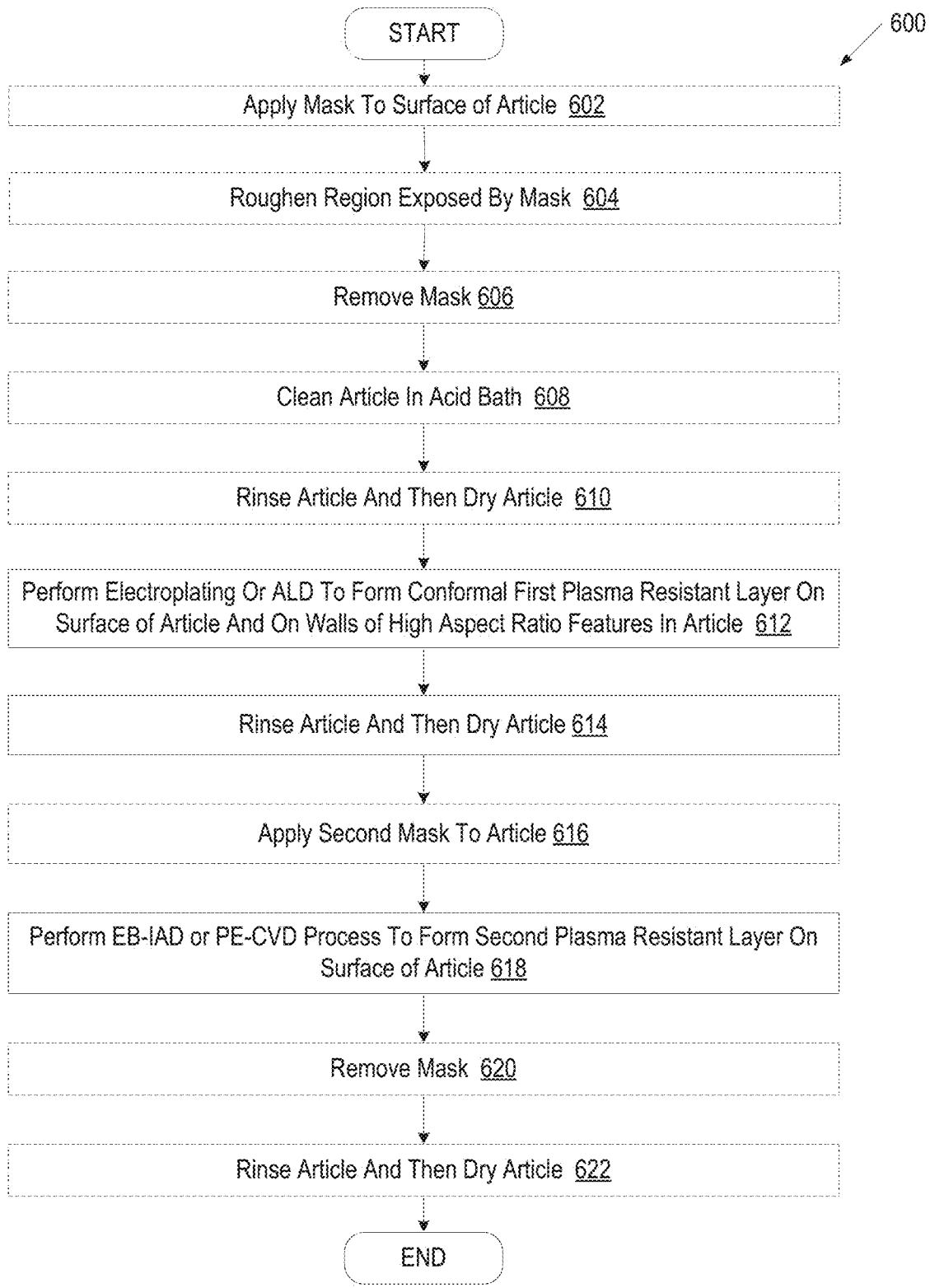
FIG. 6 illustrates another embodiment of a process for forming a multi-layer plasma resistant coating on a chamber component.

FIG. 6 illustrates another embodiment of a process 600 for forming a multi-layer plasma resistant coating on a chamber component. Process 600 is similar to process 500, except that one of physical vapor deposition (PVD), IAD (e.g., EB-IAD), or PE-CVD is performed to form a second plasma resistant layer rather than plasma spraying or aerosol deposition. Process 600 may be performed using one or more of the manufacturing machines 401 of FIG. 4.

At block 602 of process 600 a mask may be applied to a surface of an article. The article may be any article discussed herein, such as a showerhead or other chamber component for a processing chamber. The mask may expose a region of a surface of the article that will be roughened and may cover portions of the article that will not be roughened. The region of the article that will be roughened may be a region that is in direct exposure to plasma when the article is installed in a processing chamber and the processing chamber is in use. At block 604 a roughening process such as bead blasting may be performed to roughen the exposed region of the surface of the article. Bead blasting may remove surface imperfections and/or pitting on the article.

At block 606, the mask may be removed from the article. At block 608, the article may be cleaned in an acid solution as described with reference to block 508 of process 500. At block 510, the article may be rinsed in DI water. The DI water may be agitated by applying ultrasonic waves to the DI water during the rinse to help removal of particles from the article. The article is then dried by applying heat to the article.

The operations of blocks 602-610 may be omitted in some embodiments. In particular, deposition processes such as ALD, plating, EB-IAD and PE-CVD may not rely on increased surface roughness to improve adhesion. Accordingly, the operations of blocks 602-610 may be omitted to achieve a simplified process. In some embodiments, block 602 is skipped and the article is polished rather than roughened at block 604. A smoother surface may be beneficial for some deposition processes such as EB-IAD, and may also result in an increased breakdown voltage. The increased breakdown voltage may be beneficial for some chamber components such as showerheads and electrostatic chucks.

At block 612, plating or ALD is performed to form a conformal first plasma resistant layer on a surface of the article and on wall of high aspect ratio feature of the article (e.g., features having aspect ratios of 3:1, 5:1, 10:1, 20:1, 50:1, 100:1, 200:1, 300:1, and so on). The operations of block 612 may be the same as the operations of block 512 of method 500, and the first plasma resistant layer may have any of the above described compositions for the first plasma resistant layer.

At block 614, the article is rinsed in DI water and then dried. The DI water may be agitated by applying ultrasonic waves to the DI water during the rinse. An acid clean may not be performed after the plating or ALD so as not to damage the first plasma resistant layer.

At block 616, a mask may be applied to the article. The mask may cover those portions of the article that were covered by the first mask and may expose the same region of the article that was exposed by the first mask. The mask may, for example, cover high aspect ratio features of the article such as holes (e.g., gas conduits) that terminate at the surface of the article. Alternatively, the operations of block 616 may be skipped, and no mask may be applied. A second plasma resistant layer (applied at block 618) may have a thickness that will not cause holes in the article to be plugged. Accordingly, in some embodiments no mask may be applied prior to the deposition of the second plasma resistant layer.

At block 618, a PVD process, IAD process (e.g., EB-IAD process) or PE-CVD process is performed to form a second plasma resistant layer over the first plasma resistant layer at the unmasked region of the article (or at the surface of the article if the article was not masked). The second plasma resistant layer may have a thickness of about 1-10 microns (e.g., 2 µm, 3 µm, 4 µm, 5 µm, µm, 6 µm, 7 µm, 8 µm, 9 µm, etc.). The second plasma resistant layer may be composed of $Y_2O_3$, $Al_2O_3$, $Er_2O_3$, $Y_3Al_5O_{12}$, $Y_4Al_2O_9$, $Y_2O_3$, $Al_2O_3$, $YF_3$, $Er_3Al_5O_{12}$, Y—O—F (e.g., $Y_5O_4F_7$), a solid solution of $Y_2O_3$—$ZrO_2$, or a ceramic compound comprising $Y_4Al_2O_9$ and a solid-solution of $Y_2O_3$—$ZrO_2$. The second plasma resistant layer may have a porosity of less than 1%, less than 0.1%, or essentially 0%. However, in some instances the second plasma resistant layer may have vertical cracks.

At block 620, the mask may be removed from the article (if a mask was used). At block 622, the article may be rinsed using DI water and then dried. The DI water may be agitated by applying ultrasonic waves to the DI water during the rinse. A breakdown voltage of at least 500 V/mil may be achieved for the article having a multi-layer coating that comprises the first and second plasma resistant layers. In one embodiment, the breakdown voltage is 1000-1500 V/mil.

Figure 7:
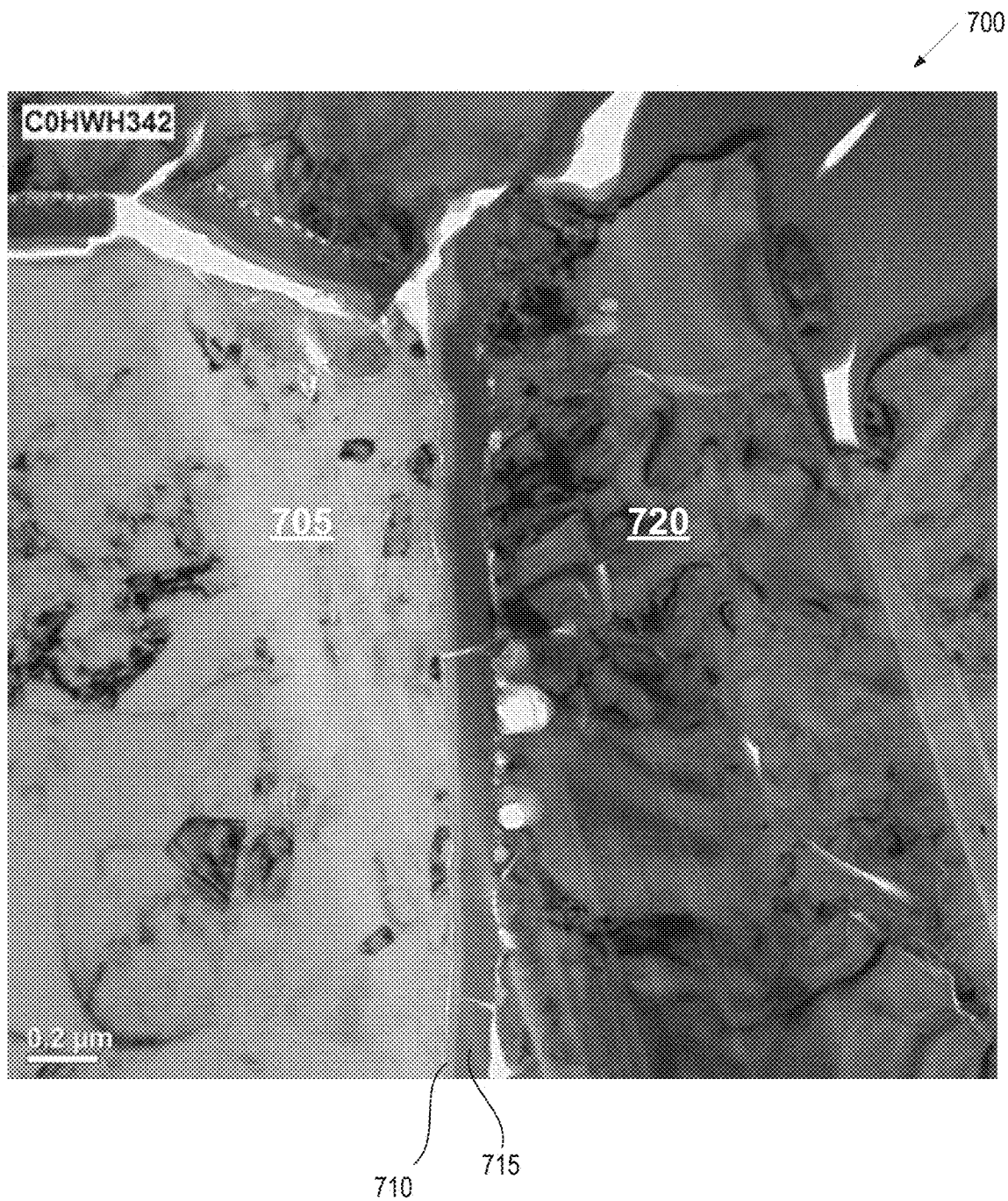
FIG. 7 is a transmission electron spectroscopy (TEM) image of an article with a coating architecture that includes a thin conformal stress relief layer, a thin conformal plasma resistant layer and a thick plasma resistant layer, in accordance with one embodiment.

FIG. 7 is a transmission electron spectroscopy (TEM) image 700 of an article with a coating architecture that includes a first thin conformal layer 710, a second thin conformal layer 715 and a thick plasma resistant layer 720, in accordance with one embodiment. In the illustrated embodiment, the article 705 (e.g., a coated chamber component such as a showerhead) is aluminum. The first thin conformal layer 710 is an amorphous $Al_2O_3$ coating formed by atomic layer deposition (ALD). The second thin conformal layer 715 is a plasma resistant layer that includes an alternating stack of $Y_2O_3$ sub-layers and $Al_2O_3$ sub-layers that is formed by ALD. The $Y_2O_3$ sub-layers were each formed by 10 cycles of $Y_2O_3$ ALD deposition and the $Al_2O_3$ sub-layers were each formed by 1 cycle of $Al_2O_3$ ALD deposition. The $Al_2O_3$ sub-layers prevent the $Y_2O_3$ sub-layers from becoming crystalline in embodiments. As a result of the $Al_2O_3$ sub-layers, the $Y_2O_3$ sub-layers remain in a polycrystalline state.

The thick plasma resistant layer 720 is a plasma sprayed $Y_2O_3$ coating. As shown, kinetic energy from the thick plasma resistant layer 720 can cause the first thin conformal layer 710 and the second thin conformal layer 715 to crack during the deposition process of the thick plasma resistant layer 720 if plasma spraying is performed to produce the thick plasma resistant layer 720. However, the first thin conformal layer 710 and the second thin conformal layer 715 only have a chance of cracking where they are impacted by (and thus covered by) the thick plasma resistant layer 720. The regions of the first thin conformal layer 710 and the second thin conformal layer 715 that are not covered by the thick plasma resistant layer 720 (e.g., features that are not in a line of site of a spray nozzle of a plasma spray gun, such as gas delivery holes of a showerhead) are not cracked. Accordingly, the cracking of the first thin conformal layer 710 and the second thin conformal layer 715 underneath the thick plasma resistant layer 720 does not negatively impact plasma resistance of the coating architecture. Moreover, aerosol deposition does not cause cracking of the first thin conformal layer 710. Accordingly, aerosol deposition may be used for the thick plasma resistant layer 720 to avoid cracking in the first thin plasma resistant layer 710.

Figure 8:
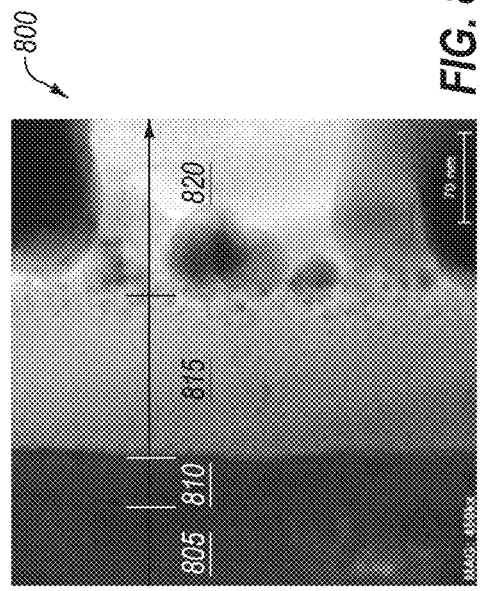
FIG. 8 is a TEM image of an article with a coating architecture that includes a thin conformal stress relief layer, a thin conformal plasma resistant layer and a thick plasma resistant layer, in accordance with one embodiment.
Figure 9:
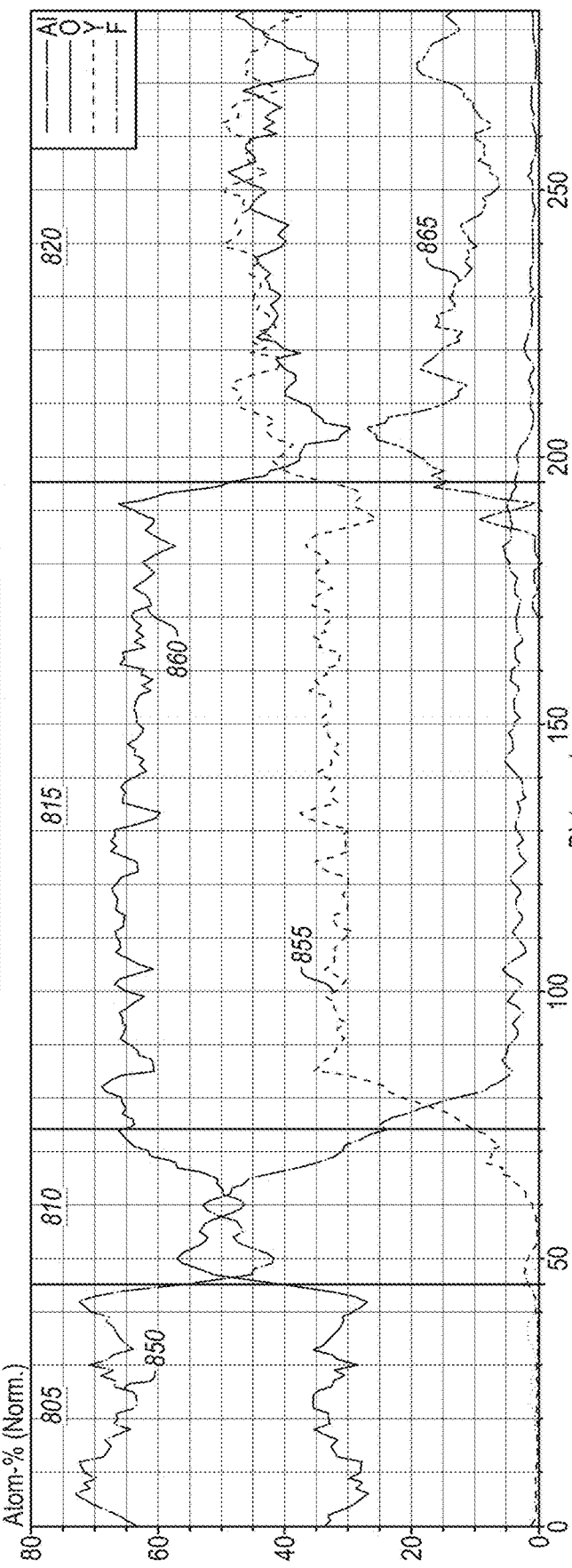
FIG. 9 is an energy dispersive electroscopy (EDS) line scan of the article shown in FIG. 8.

FIG. 8 is another TEM image 800 of an article with a coating architecture that includes a first thin conformal layer 810, a second thin conformal layer 815 and a thick plasma resistant layer 820 on an article 805, in accordance with one embodiment. The first thin conformal layer 810, second thin conformal layer 815, thick plasma resistant layer 820, and article 805 may correspond to similarly labeled first thin conformal layer 710, second thin conformal layer 715, thick plasma resistant layer 720, and article 705 of FIG. 7. FIG. 9 is an energy dispersive electroscopy (EDS) line scan of the article shown in FIG. 8. In the illustrated example, the substrate is Al 6061, the first thin conformal layer 805 has a thickness of 25 nm, the second thin conformal layer 810 has a thickness of 100 nm, and the thick plasma resistant layer 820 has a thickness of 8 mil.

Figure 10:
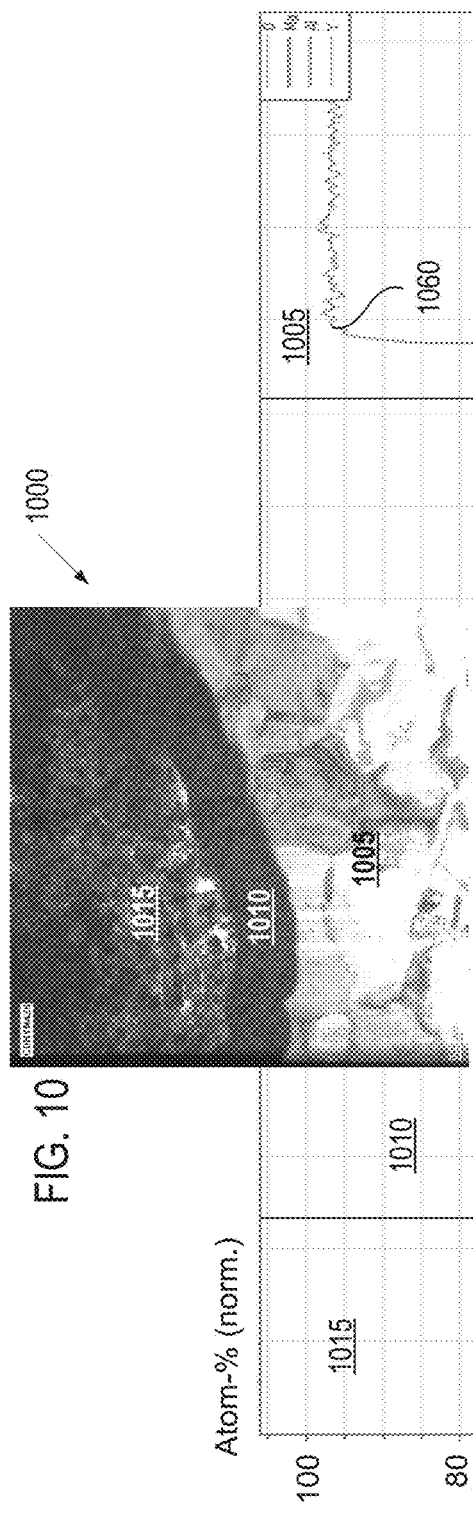
FIG. 10 is another TEM image of an article with a coating architecture that includes a thin conformal layer and a plasma resistant layer on an article, in accordance with one embodiment.
Figure 11:
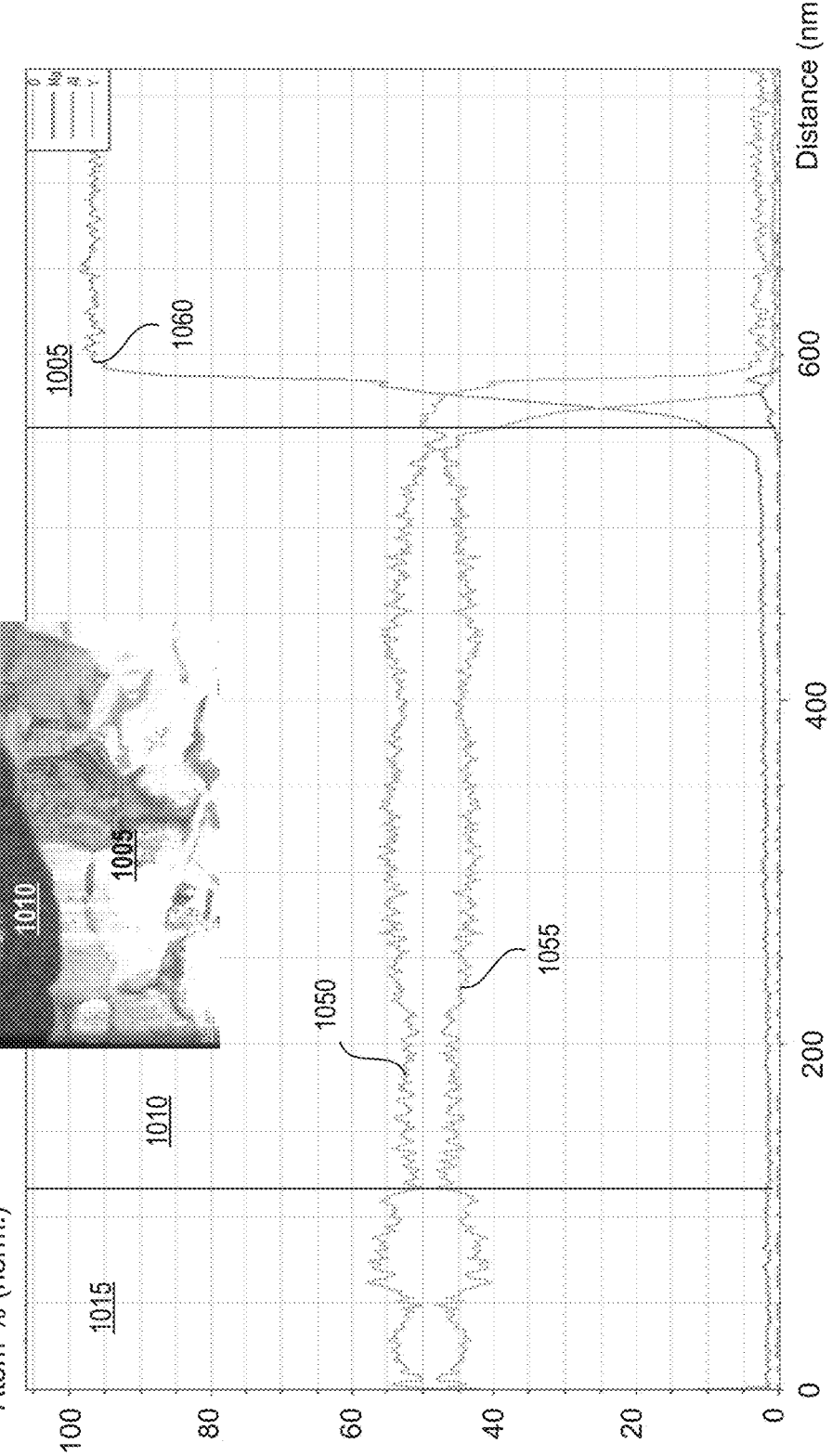
FIG. 11 is an EDS line scan of the article shown in FIG. 10.

FIG. 10 is another TEM image 1000 of an article with a coating architecture that includes a thin conformal layer 1010 and a plasma resistant layer 1015 on an article 1005, in accordance with one embodiment. FIG. 11 is an EDS line scan of the article shown in FIG. 10. In the illustrated example, the article 1005 is an aluminum article, the thin conformal layer 1010 is a $Y_2O_3$ coating deposited by ALD and has a thickness of about 480-500 nm, and the plasma resistant layer 1015 is an aerosol deposited coating. The EDS line scan shows the plasma resistant layer 1015 as having a thickness of about 120 nm. However, as shown in FIG. 10, the plasma resistant layer 1015 may have a thickness that is much greater than a thickness of the thin conformal layer 1010 (e.g., a thickness of about 8 mil). As shown, when the plasma resistant layer 1015 is deposited by aerosol deposition, the thin conformal layer 1010 does not crack.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A chamber component comprising:
   a body comprising a surface and a plurality of high aspect ratio features in the body, the plurality of high aspect ratio features having an aspect ratio of about 1:1 to about 300:1;
   a conformal first plasma resistant layer on the surface and on walls of the plurality of high aspect ratio features, the conformal first plasma resistant layer having a porosity of approximately 0% and a thickness of approximately 100 nm to approximately 1 micron; and
   a second plasma resistant layer that covers the conformal first plasma resistant layer at a region of the surface but not at the walls of the plurality of high aspect ratio features, the second plasma resistant layer having a porosity of less than 1% and a thickness of approximately 1-10 microns.

2. The chamber component of claim 1, wherein the chamber component is a chamber component for a plasma etch reactor, the chamber component comprising at least one of a metal or a sintered ceramic.

3. The chamber component of claim 1, wherein the conformal first plasma resistant layer is an atomic layer deposition (ALD) coating selected from a group consisting of $Y_2O_3$, $Al_2O_3$, $Y_3Al_5O_{12}$, $Er_3Al_5O_{12}$, $Y_5O_4F_7$ and $YF_3$.

4. The chamber component of claim 1, wherein the conformal first plasma resistant layer is a plated coating that comprises Ni.

5. The chamber component of claim 1, wherein the second plasma resistant layer is a conformal plasma resistant layer selected from a group consisting of $Y_3Al_5O_{12}$, $Y_2O_3$, $Al_2O_3$, $Er_3Al_5O_{12}$, $Y_5O_4F_7$ and $YF_3$.

6. The chamber component of claim 1, wherein the chamber component is a showerhead for a processing chamber, and wherein the plurality of high aspect ratio features are a plurality of holes in the showerhead.

7. The chamber component of claim 1, wherein a breakdown voltage of the chamber component comprising the conformal first plasma resistant layer and the second plasma resistant layer is approximately 1000-1500 volts per mil.

8. A chamber component comprising:
a body comprising a surface and a plurality of high aspect ratio features in the body, wherein the plurality of high aspect ratio features have an aspect ratio of about 1:1 to about 300:1, and wherein a region of the surface has a surface roughness of approximately 200-300 micro-inches;
a conformal first plasma resistant layer on the surface and on walls of the plurality of high aspect ratio features, the conformal first plasma resistant layer having a porosity of approximately 0% and a thickness of approximately 100 nm to approximately 10 microns, wherein a surface of the conformal first plasma resistant layer has a surface roughness that is based on the surface roughness at the region of the surface; and
a second plasma resistant layer that covers the conformal first plasma resistant layer at the region of the surface but not at the walls of the plurality of high aspect ratio features, the second plasma resistant layer having a porosity of approximately 1-5% and a thickness of approximately 4-20 mils, wherein the surface roughness of the conformal first plasma resistant layer facilitates adhesion of the second plasma resistant layer to the conformal first plasma resistant layer.

9. The chamber component of claim 8, further comprising: a conformal third plasma resistant layer that covers the second plasma resistant layer at the region of the surface and that covers the conformal first plasma resistant layer at the walls of the plurality of high aspect ratio features, the conformal third plasma resistant layer having a thickness of approximately 100 nm to approximately 10 μm and a porosity of approximately 0%, wherein the conformal third plasma resistant layer is selected from a group consisting of $Y_2O_3$, $Al_2O_3$, $Y_3Al_5O_{12}$, $Er_3Al_5O_{12}$, $Y_5O_4F_7$, and $YF_3$.

10. The chamber component of claim 8, wherein the conformal first plasma resistant layer is an atomic layer deposition (ALD) coating is selected from a group consisting of $Y_2O_3$, $Al_2O_3$, $Y_3Al_5O_{12}$, $Er_3Al_5O_{12}$, $Y_5O_4F_7$, and $YF_3$.

11. The chamber component of claim 8, wherein the conformal first plasma resistant layer is a plated coating that comprises Ni.

12. The chamber component of claim 8, wherein the second plasma resistant layer is selected from a group consisting of $Y_3Al_5O_{12}$, $Y_2O_3$, $Al_2O_3$, $Er_3Al_5O_{12}$, $Y_5O_4F_7$, and $YF_3$.

13. The chamber component of claim 8, wherein the surface of the conformal first plasma resistant layer has the surface roughness of approximately 200-300 micro-inches.

14. A method comprising: performing plating or atomic layer deposition (ALD) to form a conformal first plasma resistant layer on an chamber component, wherein the conformal first plasma resistant layer is formed on a surface of the chamber component and on walls of a plurality of high aspect ratio features in the chamber component, wherein the plurality of high aspect ratio features have an aspect ratio of about 1:1 to about 300:1, the conformal first plasma resistant layer having a porosity of approximately 0% and a thickness of approximately 100 nm to approximately 1 micron; and performing one of electron beam ion assisted deposition (EB-IAD), plasma enhanced chemical vapor deposition (PECVD), aerosol deposition or plasma spraying to form a second plasma resistant layer that covers the conformal first plasma resistant layer at a region of the surface but not at the walls of the plurality of high aspect ratio features-; wherein the second plasma resistant layer has a porosity of less than 1% and a thickness of approximately 1-10 microns.

15. The method of claim 14, further comprising:
prior to performing the plating or the ALD, roughening the region of the surface of the chamber component to a surface roughness of approximately 200-300 micro-inches, wherein the conformal first plasma resistant layer has the surface roughness of approximately 200-300 micro-inches.

16. The method of claim 15, further comprising: cleaning the chamber component using an acid after performing the roughening; performing a first rinse of the chamber component in sonicated water after cleaning the chamber component; after forming the conformal first plasma resistant layer and before forming the second plasma resistant layer, performing a second rinse of the chamber component in water; and after performing the second rinse, applying a mask to the surface of the chamber component, wherein the mask exposes the region of the surface.

17. The method of claim 15, further comprising: performing ALD to form a conformal third plasma resistant layer over the second plasma resistant layer at the surface of the chamber component and over the conformal first plasma resistant layer at the walls of the plurality of high aspect ratio features, the conformal third plasma resistant layer having a porosity of approximately 0% and a thickness of approximately 100 nm to approximately 1 μm.

18. The method of claim 14, wherein:
The conformal first plasma resistant layer is selected from a group consisting of $Y_2O_3$, $Al_2O_3$, $Y_3Al_5O_{12}$, $Er_3Al_5O_{12}$, $Y_5O_4F_7$, $YF_3$ and Ni; and
the second plasma resistant layer is selected from a group consisting of $Y_3Al_5O_{12}$, $Y_2O_3$, $Al_2O_3$, $Er_3Al_5O_{12}$, $Y_5O_4F_7$, or $YF_3$.

* * * * *